United States Patent
Goto et al.

(10) Patent No.: US 12,525,948 B2
(45) Date of Patent: Jan. 13, 2026

(54) LONGITUDINALLY LEAKY SURFACE ACOUSTIC WAVE DEVICE WITH DOUBLE SIDE ACOUSTIC MIRROR

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 369 days.

(21) Appl. No.: 17/703,342

(22) Filed: Mar. 24, 2022

(65) Prior Publication Data

US 2022/0321096 A1 Oct. 6, 2022

Related U.S. Application Data

(60) Provisional application No. 63/169,027, filed on Mar. 31, 2021, provisional application No. 63/169,014, filed on Mar. 31, 2021.

(51) Int. Cl.
*H03H 9/02* (2006.01)
*H03H 9/08* (2006.01)
(Continued)

(52) U.S. Cl.
CPC .... *H03H 9/02842* (2013.01); *H03H 9/02228* (2013.01); *H03H 9/02559* (2013.01);
(Continued)

(58) Field of Classification Search
CPC .......... H03H 9/02842; H03H 9/02228; H03H 9/02559; H03H 9/02574; H03H 9/08;
(Continued)

(56) References Cited

U.S. PATENT DOCUMENTS 5,626,767 A 5/1997 Trampler et al.
5,910,756 A 6/1999 Ella
(Continued)

FOREIGN PATENT DOCUMENTS

DE 102012205033 A1 10/2012
EP 2658123 A1 10/2013
(Continued)

OTHER PUBLICATIONS

Plessky et al., "Laterally excited bulk wave resonators (XBARs) based on thin Lithium Niobate platelet for 5GHz and 13 GHz filters", IEEE/MTT-S International Microwave Symposium, pp. 512-515 (2019).
(Continued)

*Primary Examiner* — Daniel Pihulic
(74) *Attorney, Agent, or Firm* — Knobbe, Martens, Olson & Bear, LLP

(57) ABSTRACT

A longitudinally leaky surface acoustic wave device is disclosed. The longitudinally leaky surface acoustic wave device can include a support substrate, a first solid acoustic mirror over the support substrate, a piezoelectric layer positioned over the first solid acoustic mirror, an interdigital transducer electrode over the piezoelectric layer, and a second solid acoustic mirror over the over the interdigital transducer electrode. The interdigital transducer electrode is configured to generate an acoustic wave that propagates in a lateral direction. The first solid acoustic mirror and the second solid acoustic mirror are arranged to confine acoustic energy of the acoustic wave. The piezoelectric layer can have a cut angle of (90±30, 90±30, 40±30).

20 Claims, 15 Drawing Sheets

(51) Int. Cl.
  *H03H 9/145* (2006.01)
  *H03H 9/25* (2006.01)
  *H03H 9/64* (2006.01)

(52) U.S. Cl.
  CPC .......... *H03H 9/02574* (2013.01); *H03H 9/08* (2013.01); *H03H 9/145* (2013.01); *H03H 9/25* (2013.01); *H03H 9/6483* (2013.01)

(58) Field of Classification Search
  CPC ........ H03H 9/145; H03H 9/25; H03H 9/6483; H03H 3/08; H03H 9/02866; H03H 9/0561; H03H 9/1064
  See application file for complete search history.

(56) References Cited

U.S. PATENT DOCUMENTS

| | | | |
|---|---|---|---|
| 6,262,637 B1 | 7/2001 | Bradley et al. | |
| 6,445,265 B1 | 9/2002 | Wright | |
| 6,509,813 B2 | 1/2003 | Ellae et al. | |
| 7,235,915 B2 | 6/2007 | Nakamura et al. | |
| 7,322,093 B2 | 1/2008 | Kadota et al. | |
| 7,471,027 B2 | 12/2008 | Kando | |
| 7,550,898 B2 | 6/2009 | Kadota et al. | |
| 7,576,471 B1 | 8/2009 | Solal | |
| 7,616,079 B2 | 11/2009 | Tikka et al. | |
| 7,733,198 B1 | 6/2010 | Olsson et al. | |
| 7,786,825 B2 | 8/2010 | Handtmann et al. | |
| 7,898,145 B2 | 3/2011 | Mimura et al. | |
| 7,902,717 B2 | 3/2011 | Saijou et al. | |
| 8,138,856 B2 | 3/2012 | Khelif et al. | |
| 8,248,185 B2 | 8/2012 | Choy et al. | |
| 8,294,331 B2 | 10/2012 | Abbott et al. | |
| 8,525,619 B1 | 9/2013 | Olsson et al. | |
| 8,575,820 B2 | 11/2013 | Shirakawa et al. | |
| 8,610,518 B1 | 12/2013 | Solal et al. | |
| 8,741,683 B2 | 6/2014 | Huang et al. | |
| 8,836,449 B2 | 9/2014 | Pang et al. | |
| 8,852,104 B2* | 10/2014 | Oralkan ............... | A61B 5/0068 600/427 |
| 9,136,818 B2 | 9/2015 | Burak et al. | |
| 9,219,466 B2 | 12/2015 | Meltaus et al. | |
| 9,893,712 B2 | 2/2018 | Meltaus et al. | |
| 10,090,825 B2 | 10/2018 | Kuroyanagi | |
| 10,097,158 B2 | 10/2018 | Kaneda et al. | |
| 10,164,605 B2 | 12/2018 | Burak et al. | |
| 10,211,806 B2 | 2/2019 | Bhattacharjee | |
| 10,243,536 B2 | 3/2019 | Saijo et al. | |
| 10,250,222 B2 | 4/2019 | Kuroyanagi et al. | |
| 10,305,443 B2 | 5/2019 | Bhattacharjee | |
| 10,374,573 B2 | 8/2019 | Bhattacharjee | |
| 10,389,332 B2 | 8/2019 | Bhattacharjee | |
| 10,453,636 B1 | 10/2019 | Khlat | |
| 10,601,392 B2 | 3/2020 | Plesski et al. | |
| 10,601,398 B2 | 3/2020 | Sturzebecher et al. | |
| 10,819,309 B1 | 10/2020 | Turner et al. | |
| 11,101,787 B2 | 8/2021 | Ando et al. | |
| 11,309,866 B2 | 4/2022 | Omura | |
| 11,368,137 B2 | 6/2022 | Goto et al. | |
| 11,463,065 B2 | 10/2022 | Goto | |
| 11,552,614 B2 | 1/2023 | Caron et al. | |
| 11,616,487 B2 | 3/2023 | Nakamura et al. | |
| 11,689,178 B2 | 6/2023 | Nakamura et al. | |
| 11,799,443 B2* | 10/2023 | Omura ..................... | H03H 9/64 |
| 11,894,828 B2 | 2/2024 | Nakamura et al. | |
| 12,009,797 B2* | 6/2024 | Goto ................ | H03H 9/02102 |
| 12,063,026 B2* | 8/2024 | Caron ................... | H03H 9/175 |
| 12,119,804 B2 | 10/2024 | Yamane et al. | |
| 12,136,910 B2 | 11/2024 | Goto | |
| 12,334,899 B2 | 6/2025 | Nakamura et al. | |
| 12,341,486 B2 | 6/2025 | Shin et al. | |
| 12,355,423 B2 | 7/2025 | Torazawa et al. | |
| 12,413,203 B2 | 9/2025 | Kimura | |
| 2005/0005323 A1 | 1/2005 | Birch et al. | |
| 2005/0057323 A1 | 3/2005 | Kando | |
| 2005/0206476 A1 | 9/2005 | Ella et al. | |
| 2006/0138902 A1 | 6/2006 | Kando | |
| 2007/0176710 A1 | 8/2007 | Jamneala et al. | |
| 2008/0169574 A1 | 7/2008 | Molkkari et al. | |
| 2008/0169884 A1 | 7/2008 | Matsumoto et al. | |
| 2008/0204857 A1 | 8/2008 | Godshalk et al. | |
| 2008/0297280 A1 | 12/2008 | Thalhammer et al. | |
| 2009/0009262 A1 | 1/2009 | Schmidhammer et al. | |
| 2009/0096550 A1 | 4/2009 | Handtmann et al. | |
| 2009/0115287 A1 | 5/2009 | Kando | |
| 2009/0265903 A1 | 10/2009 | Handtmann et al. | |
| 2009/0267457 A1 | 10/2009 | Barber et al. | |
| 2010/0244624 A1 | 9/2010 | Matsuda et al. | |
| 2010/0268152 A1* | 10/2010 | Oralkan ............... | A61B 8/4483 604/22 |
| 2010/0327995 A1 | 12/2010 | Reinhardt et al. | |
| 2011/0084779 A1 | 4/2011 | Zhang | |
| 2011/0109196 A1 | 5/2011 | Goto et al. | |
| 2011/0193655 A1 | 8/2011 | Kamiguchi et al. | |
| 2011/0241481 A1 | 10/2011 | Kimura et al. | |
| 2011/0266917 A1 | 11/2011 | Metzger et al. | |
| 2011/0273243 A1 | 11/2011 | Domingue et al. | |
| 2012/0025931 A1 | 2/2012 | Yamamoto et al. | |
| 2012/0049690 A1 | 3/2012 | Okamoto et al. | |
| 2012/0164753 A1 | 6/2012 | Johnston et al. | |
| 2012/0198672 A1 | 8/2012 | Ueda et al. | |
| 2013/0026881 A1 | 1/2013 | Okamoto et al. | |
| 2013/0051588 A1 | 2/2013 | Ruile et al. | |
| 2013/0099630 A1 | 4/2013 | Matsuda et al. | |
| 2013/0176085 A1 | 7/2013 | Barber et al. | |
| 2013/0285768 A1 | 10/2013 | Watanabe et al. | |
| 2014/0003196 A1 | 1/2014 | Tajima | |
| 2014/0203893 A1 | 7/2014 | Kando et al. | |
| 2014/0217566 A1 | 8/2014 | Goida et al. | |
| 2015/0028720 A1 | 1/2015 | Kando | |
| 2015/0033521 A1 | 2/2015 | Watanabe et al. | |
| 2015/0102705 A1 | 4/2015 | Iwamoto et al. | |
| 2015/0243873 A1 | 8/2015 | Nakanishi et al. | |
| 2016/0044677 A1 | 2/2016 | King et al. | |
| 2016/0149553 A1 | 5/2016 | Yoon et al. | |
| 2016/0182007 A1 | 6/2016 | Bhattacharjee | |
| 2016/0182009 A1 | 6/2016 | Bhattacharjee | |
| 2017/0111066 A1 | 4/2017 | King et al. | |
| 2017/0141752 A1 | 5/2017 | Hino | |
| 2017/0170808 A1 | 6/2017 | Iwaki et al. | |
| 2017/0179920 A1 | 6/2017 | Kawasaki | |
| 2017/0201234 A1 | 7/2017 | Jger et al. | |
| 2017/0214382 A1 | 7/2017 | Bhattacharjee | |
| 2017/0214388 A1 | 7/2017 | Irieda et al. | |
| 2017/0250674 A1 | 8/2017 | Takamine et al. | |
| 2017/0331451 A1 | 11/2017 | Yoon et al. | |
| 2017/0366163 A1 | 12/2017 | Kishimoto | |
| 2018/0019832 A1 | 1/2018 | Okuda | |
| 2018/0054179 A1 | 2/2018 | Gamble et al. | |
| 2018/0097508 A1 | 4/2018 | Iwamoto et al. | |
| 2018/0269852 A1 | 9/2018 | Daimon et al. | |
| 2018/0287587 A1 | 10/2018 | Campanella Pineda et al. | |
| 2019/0028062 A1 | 1/2019 | Jaeger et al. | |
| 2019/0089328 A1 | 3/2019 | Unterreithmeier | |
| 2019/0097606 A1 | 3/2019 | Nosaka et al. | |
| 2019/0103853 A1 | 4/2019 | Burak et al. | |
| 2019/0149123 A1 | 5/2019 | Sakashita | |
| 2019/0181827 A1 | 6/2019 | Timme et al. | |
| 2019/0199324 A1 | 6/2019 | Matsumoto et al. | |
| 2019/0253036 A1 | 8/2019 | Han et al. | |
| 2019/0326874 A1 | 10/2019 | Nakamura et al. | |
| 2019/0326875 A1 | 10/2019 | Nakamura et al. | |
| 2019/0326879 A1 | 10/2019 | Nakamura et al. | |
| 2019/0341885 A1 | 11/2019 | Jackson et al. | |
| 2019/0356296 A1 | 11/2019 | Mimura | |
| 2019/0386637 A1* | 12/2019 | Plesski ............... | H03H 9/02015 |
| 2019/0393924 A1 | 12/2019 | Campbell | |
| 2020/0028487 A1* | 1/2020 | Caron ................... | H03H 9/205 |
| 2020/0067482 A1 | 2/2020 | Maki et al. | |
| 2020/0083860 A1 | 3/2020 | Ylilammi et al. | |
| 2020/0091892 A1 | 3/2020 | Watanabe et al. | |
| 2020/0106420 A1 | 4/2020 | Kodama et al. | |
| 2020/0144984 A1 | 5/2020 | Fukuhara et al. | |
| 2020/0212876 A1 | 7/2020 | Goto et al. | |

(56) References Cited

U.S. PATENT DOCUMENTS

| | | |
|---|---|---|
| 2020/0228089 A1 | 7/2020 | Tajic et al. |
| 2020/0304092 A1 | 9/2020 | Suzuki et al. |
| 2020/0304096 A1 | 9/2020 | Suzuki et al. |
| 2020/0328727 A1 | 10/2020 | Daimon |
| 2020/0358423 A1 | 11/2020 | Pao et al. |
| 2021/0044278 A1 | 2/2021 | Kankar et al. |
| 2021/0091742 A1 | 3/2021 | Gorisse et al. |
| 2021/0111135 A1 | 4/2021 | Li et al. |
| 2021/0119602 A1 | 4/2021 | Lu et al. |
| 2021/0126625 A1 | 4/2021 | Wang et al. |
| 2021/0143793 A1 | 5/2021 | Shirakawa et al. |
| 2021/0159877 A1 | 5/2021 | Fukuhara et al. |
| 2021/0167752 A1 | 6/2021 | Caron et al. |
| 2021/0167753 A1 | 6/2021 | Goto |
| 2021/0203305 A1 | 7/2021 | Maki et al. |
| 2021/0313950 A1 | 10/2021 | Han et al. |
| 2021/0399711 A1 | 12/2021 | Ajima et al. |
| 2021/0408994 A1 | 12/2021 | Nagatomo et al. |
| 2022/0140224 A1 | 5/2022 | Hamasaki et al. |
| 2022/0149803 A1 | 5/2022 | Shuai et al. |
| 2022/0158612 A1 | 5/2022 | Goto et al. |
| 2022/0200566 A1 | 6/2022 | Kadota et al. |
| 2022/0216846 A1 | 7/2022 | Yamane et al. |
| 2022/0231651 A1 | 7/2022 | Luo |
| 2022/0286105 A1 | 9/2022 | Goto et al. |
| 2022/0321079 A1 | 10/2022 | Liu |
| 2022/0321088 A1* | 10/2022 | Goto ............... H03H 9/0561 |
| 2022/0321095 A1 | 10/2022 | Liu et al. |
| 2022/0321096 A1* | 10/2022 | Goto ............... H03H 9/02866 |
| 2022/0407487 A1 | 12/2022 | Liu |
| 2023/0103956 A1 | 4/2023 | Fukuhara et al. |
| 2023/0104500 A1 | 4/2023 | Fukuhara et al. |
| 2023/0105034 A1* | 4/2023 | Fukuhara ............... H04B 1/40 29/25.35 |
| 2023/0107728 A1* | 4/2023 | Fukuhara ............... H04B 1/40 455/73 |
| 2023/0107820 A1* | 4/2023 | Fukuhara ........... H03H 9/02228 310/365 |
| 2023/0108686 A1* | 4/2023 | Fukuhara ............... H03H 9/145 310/365 |
| 2023/0111476 A1* | 4/2023 | Fukuhara ........... H03H 9/02102 333/193 |
| 2023/0121844 A1 | 4/2023 | Goto |
| 2023/0123285 A1 | 4/2023 | Goto et al. |
| 2023/0163746 A1 | 5/2023 | Caron et al. |
| 2023/0208384 A1 | 6/2023 | Goto et al. |
| 2023/0283255 A1 | 9/2023 | Nakamura et al. |
| 2023/0378930 A1 | 11/2023 | Goto et al. |
| 2024/0356515 A1 | 10/2024 | Goto |
| 2024/0356516 A1 | 10/2024 | Caron et al. |
| 2025/0030401 A1 | 1/2025 | Goto |

FOREIGN PATENT DOCUMENTS

| | | |
|---|---|---|
| JP | 05-095249 A | 4/1993 |
| JP | 3710445 B2 | 10/2005 |
| JP | 2011-066492 A | 3/2011 |
| JP | 2015-146333 A | 8/2015 |
| JP | 2017-528060 A | 9/2017 |
| KR | 10-0799438 B1 | 1/2008 |
| KR | 10-2013-0086378 A | 8/2013 |
| SG | 10-2020-12058 | 7/2021 |
| TW | 201021409 A | 6/2010 |
| WO | 98/52279 A1 | 11/1998 |
| WO | 2010/004741 A1 | 1/2010 |
| WO | 2011/046117 A1 | 4/2011 |
| WO | 2011/158445 A1 | 12/2011 |
| WO | 2012/086639 A1 | 6/2012 |
| WO | 2017/043427 A1 | 3/2017 |
| WO | 2017/068828 A1 | 4/2017 |
| WO | 2017/138540 A1 | 8/2017 |
| WO | 2017/161303 A1 | 9/2017 |

OTHER PUBLICATIONS

Written Opinion in application No. 10202012082V, dated Sep. 15, 2023.

Yen et al., "Integrated High-performance Clocking Solutions Utilizing Mirror-encapsulated BAW Resonators", Program Digest, 2019 IEEE International Ultrasonics Symposium (IUS), Glasgow, Scotland (Oct. 6-9, 2019).

Aslam et al., "Surface acoustic wave modes characteristics of CMOS compatible SiO2/AlN/SiO2/Si multilayer structure with embedded electrodes", Sensors and Actuators A: Physical, vol. 313: 112202 (2020).

Drafts, Bill, "Acoustic Wave Technology Sensors", Fierce Electronics article, Oct. 1, 2000.

Irino, Toshio, et al., "Propagation of Boundary Acoustic Waves along a ZnO Layer between Two Materials," IEEE Ultrasonics Symposium, 1986, pp. 195-200.

Kando et al., "RF Filter using Boundary Acoustic Wave," Japanese Journal of Applied Physics, vol. 45, No. 5B, May 25, 2006, pp. 4651-4654.

Kando, Hajime, et al., "RF Filter using Boundary Acoustic Wave," 2006 IEEE Ultrasonics Symposium, pp. 188-191.

Kimura et al., "A High Velocity and Wideband SAW on a Thin LiNbO3 Plate Bonded on a Si Substrate in the SHF Range", IEEE International Ultrasonics Symposium (2019).

Pitschi et al., "Approaches to wafer level packaging for SAW components", 2013 IEEE MTT-S International Microwave Symposium Digest (MTT), 2013.

Wang, Yiliu, et al., "Change in Piezoelectric Boundary Acoustic Wave Characteristics with Overlay and Metal Grating Materials," Conference Paper, Apr. 2009, pp. 241-244.

Yamane, Takashi, et al., "A Miniaturized UMTS Band II Duplexer Employing Piezoelectric Boundary Acoustic Wave," Proceedings of the Asia-Pacific Microwave Conference 2011, pp. 550-553.

Mimura, M., et al., "Low Acoustic Velocity Rayleigh SAW Technology for Miniaturization of High Performance Tc- Saw Devices", Seventh International Symposium on Acoustic Wave Devices for Future Mobile Communication Systems., Mar. 7, 2018, 8 pages.

Nakamura, H., et al., "Suppression Mechanism of Transverse-Mode Spurious Responses in SAW Resonators on a SiO2/Al/LiNbO3 Structure", IEEE International Ultrasonics Symposium Proceedings, 2011, 4 pages.

* cited by examiner

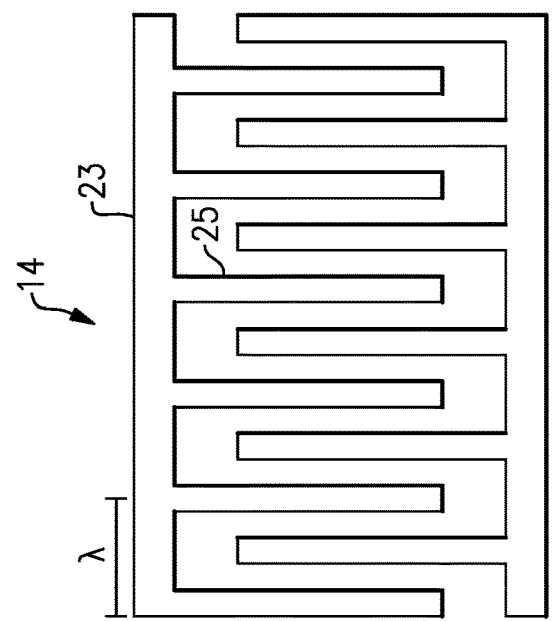
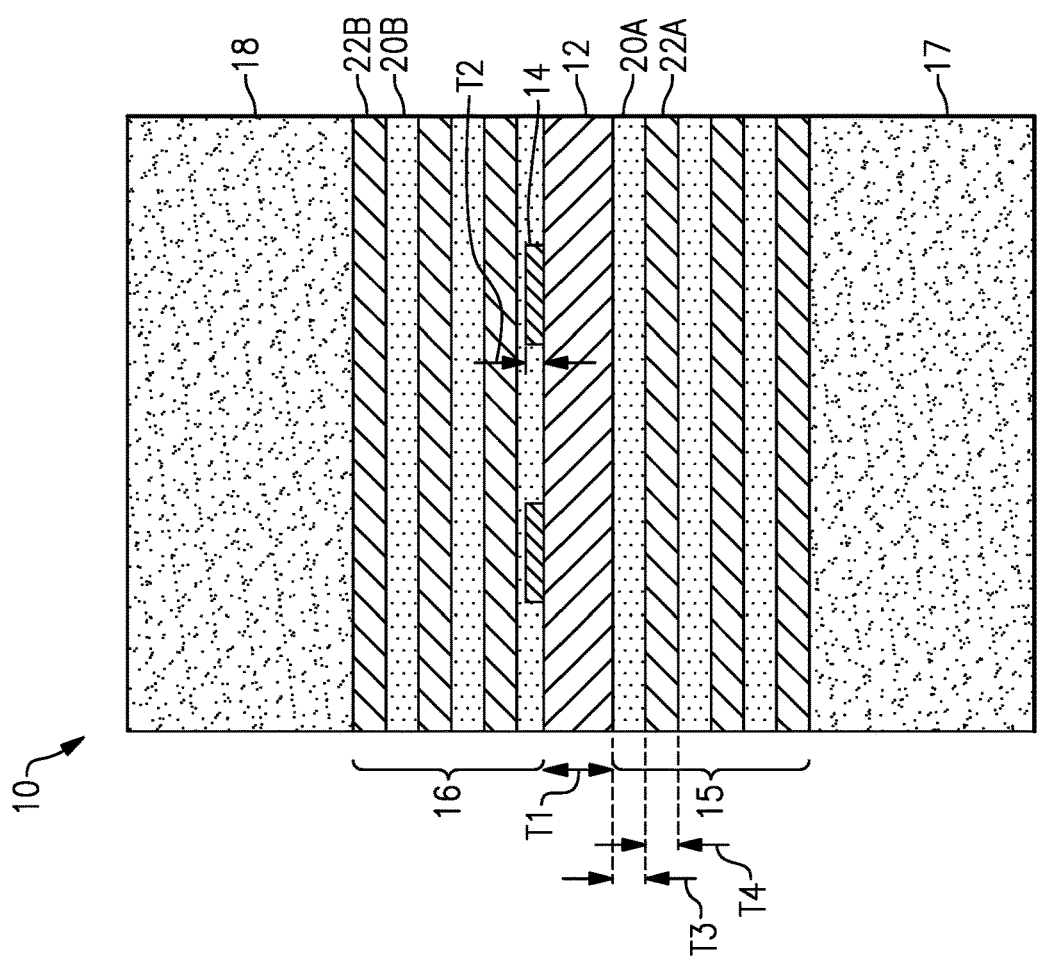

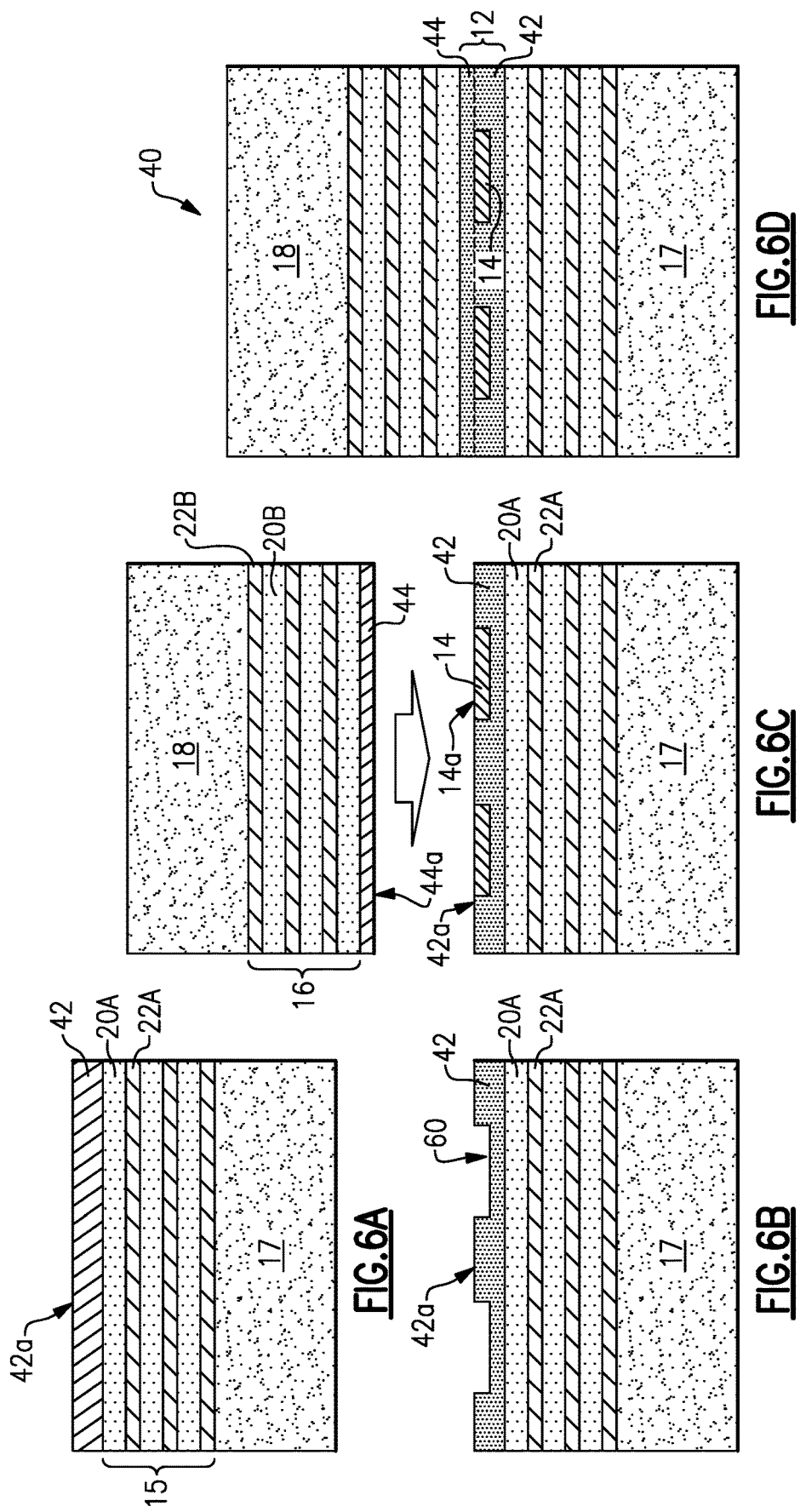

LONGITUDINALLY LEAKY SURFACE ACOUSTIC WAVE DEVICE WITH DOUBLE SIDE ACOUSTIC MIRROR

CROSS REFERENCE TO PRIORITY APPLICATION

This application claims the benefit of priority of U.S. Provisional Patent Application No. 63/169,014, filed Mar. 31, 2021 and titled "LONGITUDINALLY LEAKY SURFACE ACOUSTIC WAVE DEVICE WITH DOUBLE SIDE ACOUSTIC MIRROR," and U.S. Provisional Patent Application No. 63/169,027, filed Mar. 31, 2021 and titled "ACOUSTIC WAVE DEVICE WITH DOUBLE SIDE ACOUSTIC MIRROR," the disclosures of which are hereby incorporated by reference in their entirety herein.

BACKGROUND

Technical Field

Embodiments of this disclosure relate to acoustic wave devices.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A SAW resonator can include an interdigital transductor electrode on a piezoelectric substrate. The SAW resonator can generate a surface acoustic wave on a surface of the piezoelectric layer on which the interdigital transductor electrode is disposed. In BAW resonators, acoustic waves propagate in a bulk of a piezoelectric layer. Example BAW resonators include film bulk acoustic wave resonators (FBARs) and solidly mounted resonators (SMRs). Certain acoustic resonators can include features of SAW resonators and features of BAW resonators.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer. As another example, four acoustic wave filters can be arranged as a quadplexer.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, a longitudinally leaky surface acoustic wave device is disclosed. The longitudinally leaky surface acoustic wave device can include a support substrate, a first solid acoustic mirror over the support substrate, a piezoelectric layer positioned over the first solid acoustic mirror, an interdigital transducer electrode over the piezoelectric layer, and a second solid acoustic mirror over the interdigital transducer electrode. The interdigital transducer electrode is configured to generate an acoustic wave that propagates in a lateral direction. The first solid acoustic mirror and the second solid acoustic mirror are arranged to confine acoustic energy of the acoustic wave.

In one embodiment, the piezoelectric layer has a cut angle of (90±30, 90±30, 40±30). The piezoelectric layer can be a lithium niobate layer. A thickness of the piezoelectric layer can be in a range from 0.1 L to 0.5 L where L is a wavelength of the acoustic wave generated by the longitudinally leaky surface acoustic wave device.

In one embodiment, at least a portion of the interdigital transducer electrode is embed in the piezoelectric layer. The interdigital transducer electrode can be fully embedded in the piezoelectric layer and positioned such that a thickness of the piezoelectric layer under the interdigital transducer electrode is within 80% to 120% of a thickness of the piezoelectric layer over the interdigital transducer electrode.

In one embodiment, the substrate support substrate is a silicon substrate that is configured to dissipate heat associated with the acoustic wave. The longitudinally leaky surface acoustic wave device further includes a second substrate that is configured to dissipate heat associated with the acoustic wave. The first solid acoustic mirror and the second solid acoustic mirror can both be positioned between the support substrate and the second substrate.

In one embodiment, the first solid acoustic mirror is arranged to confine acoustic energy such that the support substrate is free from acoustic energy during operation of the longitudinally leaky surface acoustic wave device.

In one embodiment, the first solid acoustic mirror is an acoustic Bragg reflector that includes alternating low impedance and high impedance layers.

In one embodiment, a thickness of the interdigital transducer electrode is in a range from 0.035 L to 0.06 L where L is a wavelength of the acoustic wave generated by the longitudinally leaky surface acoustic wave device.

In one aspect, a longitudinally leaky surface acoustic wave component is disclosed. The longitudinally leaky surface acoustic wave component can include a first substrate, a first solid acoustic mirror positioned on the first substrate, a piezoelectric layer positioned over the first solid acoustic mirror, an interdigital transducer electrode on the piezoelectric layer, a second solid acoustic mirror positioned over the interdigital transducer electrode, and a second substrate on the second solid acoustic mirror. The interdigital transducer electrode is configured to generate an acoustic wave that propagates in a lateral direction. The first solid acoustic mirror and the second solid acoustic mirror are arranged to confine acoustic energy of the acoustic wave. The first and second solid acoustic mirrors are positioned between the first and second substrates. The first and second substrates are arranged to dissipate heat associated with the acoustic wave.

In one embodiment, the piezoelectric layer has a cut angle of (90±30, 90±30, 40±30). The longitudinally leaky surface acoustic wave component further includes a conductive via that extends through the second substrate. The conductive via can be electrically connected to a longitudinally leaky surface acoustic wave resonator that includes the interdigital transducer electrode. The longitudinally leaky surface acoustic wave component further includes a third solid acoustic mirror on the second substrate, a second piezoelectric layer on the third solid acoustic mirror, and a second interdigital transducer electrode on the second piezoelectric layer.

In one aspect, a longitudinally leaky surface acoustic wave device is disclosed. The longitudinally leaky surface acoustic wave device can include a support substrate, a first solid acoustic mirror over the support substrate, a piezoelectric layer over the first solid acoustic, an interdigital transducer electrode over the piezoelectric layer, and a second solid acoustic mirror over the interdigital transducer electrode. The piezoelectric layer has a cut angle of (90±30, 90±30, 40±30). The interdigital transducer electrode is configured to generate an acoustic wave that has a wavelength of L. The first solid acoustic mirror and the second solid acoustic mirror are arranged to confine acoustic energy of the acoustic wave.

In one embodiment, the piezoelectric layer has a cut angle of (90±15, 90±15, 40±15).

In one embodiment, the piezoelectric layer is a lithium niobate layer.

In one embodiment, a thickness of the piezoelectric layer is in a range from 0.1 L to 0.5 L.

In one embodiment, the first solid acoustic mirror is an acoustic Bragg reflector that includes alternating low impedance and high impedance layers.

In one aspect, an acoustic wave device is disclosed. The acoustic wave device can include a support substrate, a first solid acoustic mirror over the support substrate, a piezoelectric layer positioned over the first solid acoustic mirror, an interdigital transducer electrode at least partially embedded in the piezoelectric layer, and a second solid acoustic mirror over the piezoelectric layer. The interdigital transducer electrode is configured to generate an acoustic wave having a wavelength of L. The first solid acoustic mirror and the second solid acoustic mirror are arranged to confine acoustic energy of the acoustic wave.

In one embodiment, an upper surface of the interdigital transducer electrode is flush with an upper surface of the piezoelectric layer.

In one embodiment, the interdigital transducer electrode is fully embedded in the piezoelectric layer and positioned such that a thickness of the piezoelectric layer under the interdigital transducer electrode is within 80% to 120% of a thickness of the piezoelectric layer over the interdigital transducer electrode.

In one embodiment, the acoustic wave device is a longitudinally leaky surface acoustic wave device. The piezoelectric layer can include a cut angle of (90±30, 90±30, 40±30). The piezoelectric layer can be a lithium niobate layer. A thickness of the piezoelectric layer can be in a range from 0.1 L to 0.5 L.

In one embodiment, the support substrate is a silicon substrate that is configured to dissipate heat associated with the acoustic wave. The acoustic wave device further includes a second substrate that is configured to dissipate heat associated with the acoustic wave. The first solid acoustic mirror and the second solid acoustic mirror can both be positioned between the support substrate and the second substrate.

In one embodiment, the first solid acoustic mirror is arranged to confine acoustic energy such that the support substrate is free from acoustic energy during operation of the acoustic wave device.

In one embodiment, the first solid acoustic mirror is an acoustic Bragg reflector that includes alternating low impedance and high impedance layers.

In one embodiment, a thickness of the interdigital transducer electrode is in a range from 0.035 L to 0.06 L.

In one aspect, an acoustic wave component is disclosed, the acoustic wave device can include a first substrate, a first solid acoustic mirror positioned on the first substrate, a piezoelectric layer positioned over the first solid acoustic mirror, an interdigital transducer electrode on the piezoelectric layer, a second solid acoustic mirror positioned over the interdigital transducer electrode, and a second substrate on the second solid acoustic mirror. The piezoelectric layer has a first side facing away the first solid acoustic mirror and a second side opposite the first side and facing the first solid acoustic mirror. The interdigital transducer electrode has an upper side and a lower side opposite the upper side. The lower side is positioned below the first side of the piezoelectric layer. The interdigital transducer electrode is configured to generate an acoustic wave having a wavelength of L. The first solid acoustic mirror and the second solid acoustic mirror are arranged to confine acoustic energy of the acoustic wave. The first and second solid acoustic mirrors are positioned between the first and second substrates. The first and second substrates are arranged to dissipate heat associated with the acoustic wave.

In one embodiment, the upper side of the interdigital transducer electrode is flush with the first side of the piezoelectric layer. The acoustic wave component further includes a conductive via that extends through the second substrate. The conductive via can be electrically connected to a longitudinally leaky surface acoustic wave resonator that includes the interdigital transducer electrode. The acoustic wave component further includes a third solid acoustic mirror on the second substrate, a second piezoelectric layer on the third solid acoustic mirror, and a second interdigital transducer electrode on the second piezoelectric layer.

In one aspect, an acoustic wave device is disclosed. The acoustic wave device can include a support substrate, a first solid acoustic mirror over the support substrate, a piezoelectric layer over the first solid acoustic mirror, an interdigital transducer electrode on the piezoelectric layer, and a second solid acoustic mirror over the interdigital transducer electrode. The piezoelectric layer has a first side facing away the first solid acoustic mirror and a second side opposite first side and facing the first solid acoustic mirror. The interdigital transducer electrode has an upper side and a lower side opposite the upper side. The lower side is positioned below the first side of the piezoelectric layer. The interdigital transducer electrode is configured to generate an acoustic wave having a wavelength of L. The first solid acoustic mirror and the second solid acoustic mirror are arranged to confine acoustic energy of the acoustic wave.

In one embodiment, the upper side of the interdigital transducer electrode is flush with the first side of the piezoelectric layer.

In one embodiment, the upper side of the interdigital transducer electrode is positioned below the first side of the piezoelectric layer.

In one embodiment, the interdigital transducer electrode is fully embedded in the piezoelectric layer and positioned such that a thickness of the piezoelectric layer between the first side of the piezoelectric layer and the upper side of the interdigital transducer electrode is within 80% to 120% of a thickness of the piezoelectric layer between the second side of the piezoelectric layer and the lower side of the interdigital transducer electrode.

In one embodiment, the acoustic wave device is a laterally excited bulk acoustic wave device or a longitudinally leaky surface acoustic wave device.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/703,367, titled "ACOUSTIC WAVE DEVICE WITH DOUBLE SIDE ACOUSTIC MIRROR," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 1A is a cross sectional diagram of an acoustic wave device according to an embodiment.

FIG. 1B is a plan view of an interdigital transducer (IDT) electrode of the acoustic wave device of FIG. 1A.

FIG. 6A illustrates a step in a manufacturing process of manufacturing the acoustic wave device illustrated in FIG. 4.

FIG. 6B illustrates another step in the manufacturing process of manufacturing the acoustic wave device illustrated in FIG. 4.

FIG. 6C illustrates another step in the manufacturing process of manufacturing the acoustic wave device illustrated in FIG. 4.

FIG. 6D illustrates another step in the manufacturing process of manufacturing the acoustic wave device illustrated in FIG. 4.

DETAILED DESCRIPTION OF CERTAIN EMBODIMENTS

Figure 2:
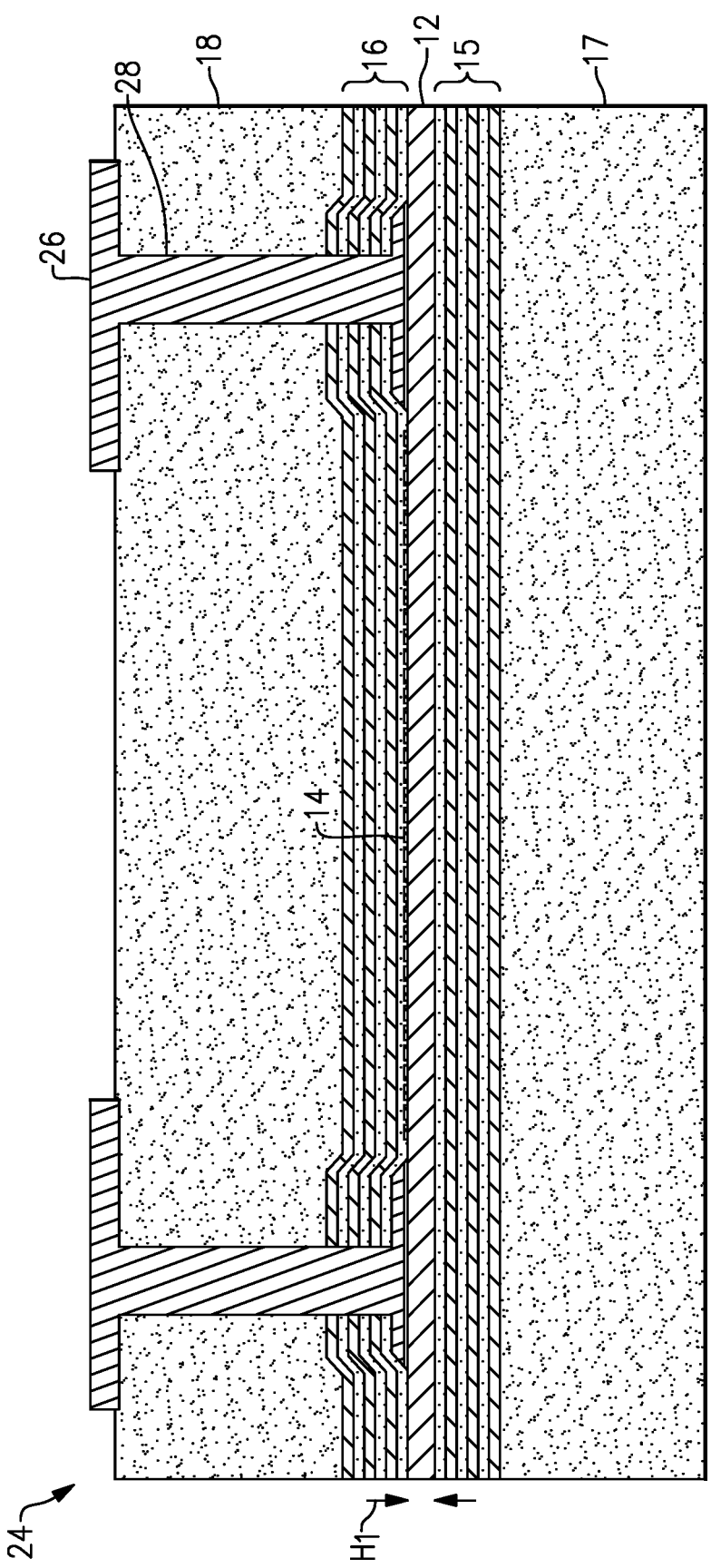
FIG. 2 is a cross sectional diagram of an acoustic wave component with an acoustic wave device with a double solid acoustic mirror structure according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave devices such as longitudinally leaky surface acoustic wave (LLSAW) resonators or laterally excited bulk acoustic wave (BAW) resonators, can be included in acoustic wave filters for high frequency bands, such as frequency bands above 3 gigahertz (GHz) and/or frequency bands above 5 GHz. Such frequency bands can include a fifth generation (5G) New Radio (NR) operating band. Certain acoustic wave devices can include an interdigital transducer (IDT) electrode on a piezoelectric layer. An operation frequency of an LLSAW can be set mainly by a pitch of the IDT electrode. An operation frequency of a BAW resonator can be set mainly by a thickness of the piezoelectric layer. A BAW mode excited by the IDT electrode is not strongly affected by the pitch of the IDT electrode in certain applications.

By bonding a piezoelectric layer to a support substrate with a relatively high thermal conductivity, heat dissipation and mechanical ruggedness can be improved. However, by bonding the piezoelectric layer directly to the support substrate, resonant characteristics can be degraded by leakage into support substrate. A solid acoustic mirror can be provided between the piezoelectric layer and the support substrate. The solid acoustic mirror, which can be an acoustic Bragg reflector, can reduce leakage into the support substrate.

However, a relatively high quality factor (Q), a relatively large electromechanical coupling coefficient ($K^2$), relatively high frequency ability, and a spurious free response, which, in general, can be significant aspects for acoustic wave elements to enable low-loss filters, delay lines, stable oscillators, and sensitive sensors, may not be obtained in such acoustic wave devices. Relatively high or reliable power durability and/or mechanical ruggedness may not be obtained in such acoustic wave devices. A relatively high acoustic velocity may not be obtained in such acoustic wave devices. Further packaging process may be required in such acoustic wave devices.

Aspects of this disclosure relate to a longitudinally leaky surface acoustic wave resonator that includes a piezoelectric layer positioned between a first solid acoustic mirror and a second acoustic mirror of a double solid acoustic mirror structure. The first solid acoustic mirror can be positioned over a first substrate and the second solid acoustic mirror can be positioned over a second substrate. An IDT electrode can be positioned on the piezoelectric layer. Such a longitudinally leaky surface acoustic wave resonator can achieve desirable heat dissipation and mechanical ruggedness. At the same time, the longitudinally leaky surface acoustic wave resonator can achieve a relatively high frequency resonance, a relatively high acoustic velocity, a relatively high $k^2$, and/or desirable power durability. The longitudinally leaky surface acoustic wave resonator disclosed herein can have a packageless structure that requires no additional packaging process. A package structure of the longitudinally leaky surface acoustic wave resonator can be less complex relative to a longitudinally leaky surface acoustic wave resonator with an air cavity.

Aspects of this disclosure relate to an acoustic wave device that includes a piezoelectric layer positioned between a first solid acoustic mirror and a second acoustic mirror of a double solid acoustic mirror structure, and an IDT electrode that is at least partially embedded in the piezoelectric layer. The first solid acoustic mirror can be positioned over a first substrate and the second solid acoustic mirror can be positioned over a second substrate. Such an acoustic wave device can achieve desirable heat dissipation and mechanical ruggedness. At the same time, the acoustic wave device can achieve a relatively high frequency resonance, a relatively high acoustic velocity, a relatively high $k^2$, and/or desirable power durability. The acoustic wave device can have a packageless structure that requires no additional packaging process. A package structure of the acoustic wave device can be less complex relative to an acoustic wave device with an air cavity.

An acoustic wave device including any suitable combination of features disclosed herein can be included in a filter arranged to filter a radio frequency signal in, for example, a fifth generation 5G NR operating band within Frequency Range 1 (FR1). A filter arranged to filter a radio frequency signal in a 5G NR operating band can include one or more acoustic wave devices disclosed herein. FR1 can be from 410 MHz to 7.125 GHz, for example, as specified in a current 5G NR specification.

An acoustic wave device disclosed herein can be included in a filter arranged to filter a radio frequency signal having a frequency above FR1. For example, an acoustic wave device can be included in a filter arranged to filter radio frequency signals in a range from 10 GHz to 25 GHz. In applications where such high frequency signals are being transmitted, higher transmit powers can be used to account for higher loss in communication channels at higher frequencies. Accordingly, thermal dissipation at high frequencies of acoustic wave devices disclosed herein can be desirable.

In certain 5G applications, the thermal dissipation of the acoustic wave disclosed herein can be advantageous. For example, such thermal dissipation can be desirable in 5G applications with a higher time-division duplexing (TDD) duty cycle compared to fourth generation (4G) Long Term Evolution (LTE) applications. As another example, there can be more ganging of filters and carrier aggregation in 5G applications than 4G LTE applications. Accordingly, signals can have higher power to account for losses associated with such ganging of filters and/or carrier aggregation. Thermal dissipation of acoustic wave devices disclosed herein can be implemented in these example applications to improve performance of filters. One or more acoustic wave devices in accordance with any suitable principles and advantages disclosed herein can be included in a filter arranged to filter a radio frequency signal in a 4G LTE operating band and/or in a filter having a passband that includes a 4G LTE operating band and a 5G NR operating band.

FIG. 1A is a schematic cross-sectional side view of an acoustic wave device, such as a longitudinally leaky surface acoustic wave (LLSAW) device 10, according to an embodiment. In the LLSAW, longitudinal wave components are more dominant than transversal wave components. The longitudinally leaky acoustic wave device 10 can be a longitudinally leaky acoustic wave device resonator included in a filter. The LLSAW device 10 can be implemented in relatively high frequency acoustic wave filters. Such acoustic wave filters can filter radio frequency signals having a frequencies above 3 GHz or above 5 GHz. As illustrated, the LLSAW device 10 includes a piezoelectric layer 12, an IDT electrode 14, a first solid acoustic mirror 15, a second solid acoustic mirror 16, a first substrate 17, and a second substrate 18. The solid acoustic mirrors 15 and 16 can confine acoustic energy in the piezoelectric layer 12. The substrates 17 and 18 can function like heat sinks. The substrates 17 and 18 can provide thermal dissipation and improve power durability of the LLSAW device 10.

FIG. 1B illustrates the IDT electrode 14 of the LLSAW device 10 of FIG. 1A in a plan view. Only the IDT electrode 14 of the LLSAW device 10 is shown in FIG. 1B. The IDT electrode 14 includes a bus bar 23 and IDT fingers 25 extending from the bus bar 23. The IDT fingers 25 have a pitch of λ, (a wavelength of a surface acoustic wave generated by the LLSAW device 10). The wave generated by the LLSAW device 10 is a P wave.

The piezoelectric layer 12 can be a lithium based piezoelectric layer. In some embodiments, the LN layer can have a cut angle of about (90, 90, 40). For example, the LN layer can have a cut angle of about (90±30, 90±30, 40±30), or about (90±15, 90±15, 40±15). As another example, the piezoelectric layer 12 can be a lithium tantalate (LT) layer. In certain applications, the piezoelectric layer 12 can be an aluminum nitride layer. The piezoelectric layer 12 can be any other suitable piezoelectric layer.

The piezoelectric layer 12 has a thickness T1. The thickness T1 of the piezoelectric layer 12 can be selected based on a wavelength λ or L of a surface acoustic wave generated by the LLSAW device 10. The IDT electrode 14 has a pitch that sets the wavelength λ, or L of the LLSAW device 10. The piezoelectric layer 12 can be sufficiently thick to avoid significant frequency variation. In some embodiments, the thickness T1 of the piezoelectric layer 12 can be in a range of, for example, 0.1 L to 1 L, 0.1 L to 0.5 L, 0.1 L to 0.4 L, 0.1 L to 0.3 L, 0.15 L to 0.4 L, 0.15 L to 0.3 L, or 0.15 L to 0.25 L. In some embodiments, the wavelength L of the surface acoustic wave can be, for example, 1.7 μm and the thickness T1 of the piezoelectric layer 12 can be about 340 nm, in some embodiments.

In certain surface acoustic wave resonators, there can be horizontal acoustic wave propagation. In such surface acoustic wave resonators, an IDT electrode pitch can set the resonant frequency. Limitations of photolithography can set a lower bound on the IDT electrode pitch and, consequently, the resonant frequency of certain surface acoustic wave resonators.

In some embodiments, the IDT electrode 14 can include aluminum (Al). The IDT electrode 14 may include other metals, such as, molybdenum (Mo), copper (Cu), Magnesium (Mg), tungsten (W), gold (Au), silver (Ag), copper (Cu), platinum (Pt), ruthenium (Ru), titanium (Ti), etc. The IDT electrode 14 may include alloys, such as AlMgCu, AlCu, etc. In some embodiments, the IDT electrode 14 can have a multi-layer IDT electrode structure.

The IDT electrode 14 has a thickness T2. In some embodiments, the thickness T2 can be about 0.047 L. For example, the thickness T2 of the IDT electrode 14 can be in a range of, for example, 0.02 L to 0.16 L, 0.035 L to 0.06 L, 0.04 L to 0.06 L, 0.035 L to 0.05 L, 0.045 L to 0.06 L, or 0.045 L to 0.05 L. In some embodiments, the wavelength L of the surface acoustic wave can be, for example, 1.7 µm and the thickness T2 of the piezoelectric layer 12 can be about 80 nm, in some embodiments.

The first solid acoustic mirror 15 includes alternating low impedance layers 20A and high impedance layers 22A. The first solid acoustic mirror 15 is an acoustic Bragg reflector. The second solid acoustic mirror 16 includes alternating low impedance layers 20B and high impedance layers 22B. The second solid acoustic mirror 16 is an acoustic Bragg reflector. The low impedance layers 20A and/or 20B can be any suitable low impedance material such as silicon dioxide ($SiO_2$) or the like. The low impedance layers 20A and 20B can be the same material as each other in certain applications. The high impedance layers 22A and/or 22B can be any suitable high impedance material such as platinum (Pt), tungsten (W), iridium (Ir), aluminum nitride (AlN), molybdenum (Mo), or the like. The high impedance layers 22A and 22B can be the same material as each other in certain applications. The high impedance layers 22A, 22B have greater impedance than the low impedance layers 20A, 20B.

As illustrated, the layer of the first solid acoustic mirror 15 closest to the piezoelectric layer 12 is a low impedance layer 20A. Having a low impedance layer 20A closest to the piezoelectric layer 12 can increase an electromechanical coupling coefficient ($k^2$) of the LLSAW device 10 and/or bring a temperature coefficient of frequency (TCF) of the LLSAW device 10 closer to 0 in certain instances.

As illustrated, the layer of the first solid acoustic mirror 15 closest to the first substrate 17 is a high impedance layer 22A. Having a high impedance layer 22A closest to the first substrate 17 can increase reflection of the layer of the first solid acoustic mirror 15 closest to the first substrate 17. Alternatively, a solid acoustic mirror (not illustrated) with a low impedance layer 20A closest to the first substrate 17 can have a higher adhesion with the first substrate 17. For example, when the first substrate 17 is a silicon substrate, the first substrate 17 can have a higher adhesion with a solid acoustic mirror with a silicon dioxide low impedance layer 20A that is closest to the support substrate (not illustrated) relative to having a platinum high impedance layer 22A closest to the first substrate 17. A low impedance layer of an acoustic mirror in contact with the first substrate 17 can have a reduced thickness compared to other low impedance layers of the acoustic mirror in certain applications.

As illustrated, the layer of the second solid acoustic mirror 16 closest to the piezoelectric layer 12 is a low impedance layer 20B. Having a low impedance layer 20B closest to the piezoelectric layer 12 can increase an electromechanical coupling coefficient ($K^2$) of the LLSAW device 10 and/or bring a TCF of the LLSAW device 10 closer to 0 in certain instances.

As illustrated, the layer of the second solid acoustic mirror 16 closest to the second substrate 18 is a high impedance layer 22B. Having a high impedance layer 22B closest to the second substrate 18 can increase reflection of the layer of the second solid acoustic mirror 16 closest to the second substrate 18. Alternatively, a solid acoustic mirror (not illustrated) with a low impedance layer 20B closest to the second substrate 18 can have a higher adhesion with the first substrate 18. A low impedance layer of an acoustic mirror in contact with the second substrate 18 can have a reduced thickness compared to other low impedance layers of the acoustic mirror in certain applications.

The low impedance layer 20A has a third thickness T3. In some embodiments, the third thickness T3 can be about 0.14 L or about 238 nm. For example, the third thickness T3 can be in a range of 0.1 L to 0.2 L, 0.12 L to 0.2 L, 0.1 L to 0.17 L, or 0.12 L to 0.17 L, or in a range of 200 nm to 270 nm, 220 nm to 270 nm, 200 nm to 250 nm, or 220 nm to 250 nm. The low impedance layer 20B can have similar or the same thickness as the third thickness T3 of the low impedance layer 20A.

The high impedance layer 22A has a fourth thickness T4. In some embodiments, the fourth thickness T4 can be about 0.09 L or about 153 nm. For example, the fourth thickness T4 can be in a range of 0.05 L to 0.15 L, 0.07 L to 0.15 L, 0.05 L to 0.12 L, or 0.07 L to 0.12 L, or in a range of 120 nm to 180 nm, 140 nm to 180 nm, 120 nm to 160 nm, or 140 nm to 160 nm. The high impedance layer 22B can have similar or the same thickness as the fourth thickness T4 of the high impedance layer 22A.

The first substrate 17 can be any suitable support substrate. The first substrate 17 can have a relatively high thermal conductivity to dissipate heat associated with operation of the LLSAW device 10. The first substrate 17 can be a silicon substrate. The first substrate 17 being a silicon substrate can be advantageous for processing during manufacture of the LLSAW device 10 and provide desirable thermal conductivity. Silicon is also a relatively inexpensive material. The first substrate 17 can be an aluminum nitride substrate. In some other applications, the first substrate 17 can be a quartz substrate, a ceramic substrate, a glass substrate, a spinel substrate, a magnesium oxide spinel substrate, a sapphire substrate, a diamond substrate, a diamond like carbon substrate, a silicon carbide substrate, a silicon nitride substrate, or the like.

The second substrate 18 can be any suitable substrate. The second substrate 18 can have a relatively high thermal conductivity to dissipate heat associated with operation of the LLSAW device 10. The second substrate 18 can be a silicon substrate. The second substrate 18 can be an aluminum nitride substrate. In some other applications, the second substrate 18 can be a quartz substrate, a ceramic substrate, a glass substrate, a spinel substrate, a magnesium oxide spinel substrate, a sapphire substrate, a diamond substrate, a diamond like carbon substrate, a silicon carbide substrate, a silicon nitride substrate, or the like.

In certain instances, the first substrate 17 and the second substrate 18 can have similar thicknesses to account for thermal expansion. The first substrate 17 and the second substrate 18 can be of the same material in certain applications.

FIG. 2 is a cross sectional diagram of an acoustic wave component 24 with an acoustic wave device with a double solid acoustic mirror structure according to an embodiment.

The acoustic wave device can include, for example the LLSAW device 10 illustrated in FIG. 1A. In some embodiments, the acoustic wave component 24 can include any of the acoustic wave devices disclosed herein. In certain applications, the structure of the caustic wave devices disclosed herein allows the acoustic wave component 24 to have a packageless structure. The acoustic wave component 24 includes a first substrate 17, a first solid acoustic mirror 15 on the first substrate 17, a piezoelectric layer 12 on the first solid acoustic mirror 15, an IDT electrode 14 on the piezoelectric layer 12, a second solid acoustic mirror 16 on the piezoelectric layer 12 and the IDT electrode 14, and a second substrate 18 on the second solid acoustic mirror 16. The acoustic wave component 24 also includes input/output contacts 26 and conductive vias 28. The input/output contacts 26 can be pins, for example. An input/output contact 26 can be electrically connected to one or more laterally excited bulk acoustic wave devices of the acoustic wave component by way of a conductive via 28.

As illustrated, the conductive vias 28 can extend through the second substrate 18 and the second solid acoustic mirror 16. In some other instances (not illustrated), one or more conductive vias can extend through the first substrate 17. In such instances, there can be one or more input/output contacts on a side of the first substrate 17 opposite to the piezoelectric layer that are electrically connected to the one or more conductive vias.

Figure 3:
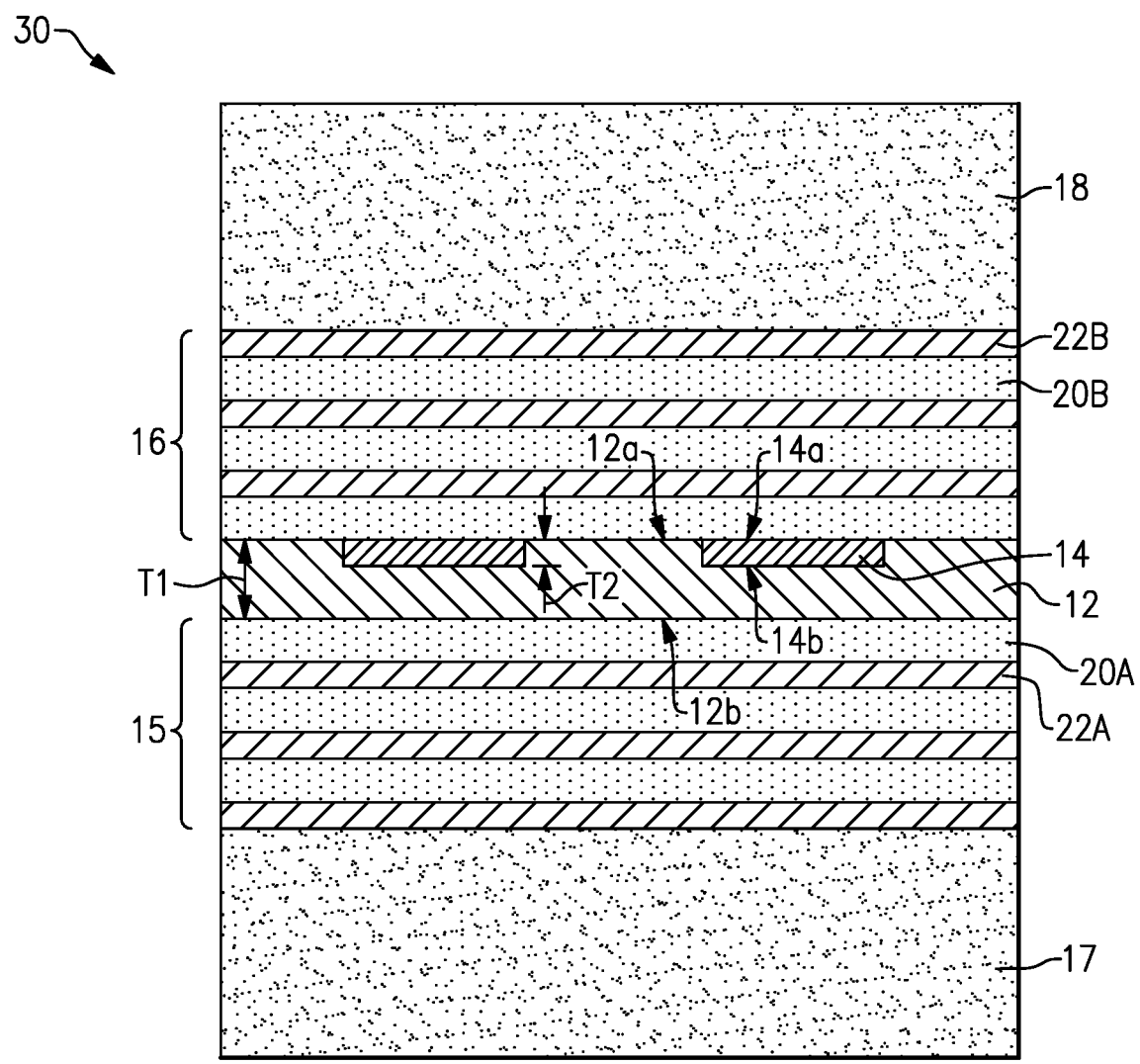
FIG. 3 is a schematic cross-sectional side view of an acoustic wave device according to an embodiment.
Figure 4:
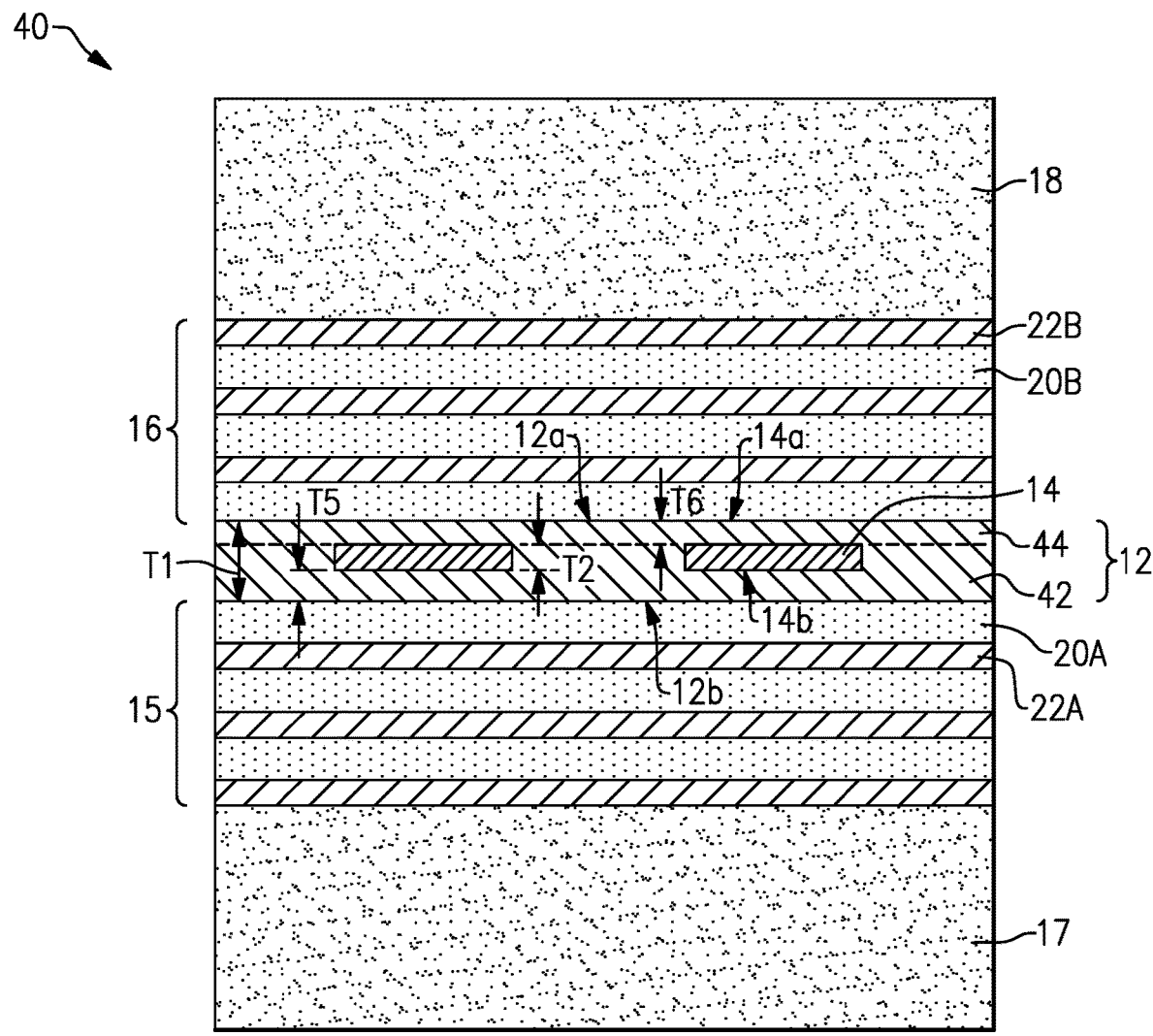
FIG. 4 is a schematic cross-sectional side view of an acoustic wave device according to another embodiment.

FIG. 3 is a schematic cross-sectional side view of an acoustic wave device 30 according to an embodiment. FIG. 4 is a schematic cross-sectional side view of an acoustic wave device 40 according to another embodiment. The acoustic wave devices 30, 40 illustrated in FIGS. 3 and 4 can be similar to the LLSAW 10 illustrated in FIG. 1A. Unless otherwise noted, components of the acoustic wave devices 30, 40 may be the same or generally similar to like components of any acoustic wave device disclosed herein, such as the LLSAW 10.

Unlike the IDT electrode 14 illustrated in FIG. 1A that is disposed on the piezoelectric layer 12, the IDT electrode 14 in FIG. 3 is at least partially embedded in the piezoelectric layer 12. The piezoelectric layer 12 has an upper side 12a and a lower side 12b, and the IDT electrode 14 has an upper side 14a and a lower side 14b. In some embodiments, the lower side 14b of the IDT electrode 14 can be positioned below the upper side 12a of the piezoelectric layer, and the upper side 14a of the IDT electrode 14 can be flush with the upper side 12a of the piezoelectric layer 12. In some other embodiments, the lower side 14b of the IDT electrode 14 can be positioned below the upper side 12a of the piezoelectric layer, and the upper side 14a of the IDT electrode 14 can be positioned above the upper side 12a of the piezoelectric layer 12. In some other embodiments, the lower side 14b of the IDT electrode 14 can be positioned below the upper side 12a of the piezoelectric layer, and the upper side 14a of the IDT electrode 14 can be positioned below the upper side 12a of the piezoelectric layer 12. By having the IDT electrode 14 at least partially embedded in the piezoelectric layer 12, the acoustic wave device 30 can have a more horizontally symmetrical structure as compared to the LLSAW 10.

In FIG. 4, the piezoelectric layer 12 can include a first piezoelectric layer 42 and a second piezoelectric layer 44. Like the IDT electrode 14 in FIG. 3, the IDT electrode 14 in FIG. 4 can be at least partially embedded in the piezoelectric layer 12. In some embodiments, the lower side 14b of the IDT electrode 14 can be positioned below the upper side 12a of the piezoelectric layer, and the upper side 14a of the IDT electrode 14 can also be positioned below the upper side 12a of the piezoelectric layer 12. In such embodiments, the IDT electrode 14 can be formed in an opening or cavity formed in the first piezoelectric layer 42, and the second piezoelectric layer 44 can be provided on the first piezoelectric layer 42 and the IDT electrode 14. By having the IDT electrode 14 at least partially embedded in the piezoelectric layer 12, the acoustic wave device 40 can have a more horizontally symmetrical structure as compared to the LLSAW 10.

In some embodiments, a thickness T5 of the piezoelectric layer 12 under the IDT electrode 14 can be the same or similar to a thickness T6 of the piezoelectric layer 12 over the IDT electrode 14. In some embodiments, the thickness T5 can be within, for example, 80% to 120%, 90% to 120%, 80% to 110%, or 90% to 110% of the thickness T6.

In certain acoustic wave devices, there can be horizontal acoustic wave propagation. In such acoustic wave devises, such as SAW devices (e.g., LLSAW devices), the IDT electrode pitch can set the resonant frequency. Limitations of photolithography can set a lower bound on the IDT electrode pitch and, consequently, resonant frequency of the acoustic wave devices. In certain acoustic wave devices, there can be vertical acoustic wave propagation. In such acoustic wave devices, such as BAW devices, the thickness T1 of the piezoelectric layer 12 can set the resonant frequency. Different structures of the piezoelectric layer 12 can provide different acoustic wave propagation directions.

The piezoelectric layer 12 can be a lithium based piezoelectric layer. For example, the piezoelectric layer 12 can be a lithium niobate (LN) layer. As another example, the piezoelectric layer 12 can be a lithium tantalate (LT) layer. In certain applications, the piezoelectric layer 12 can be an aluminum nitride layer. The piezoelectric layer 12 can be any other suitable piezoelectric layer.

In some embodiments, the acoustic wave devices 30, 40 can have a LN layer as the piezoelectric layer 12 and the LN layer can have a cut angle of about (90, 90, 40). For example, the LN layer can have a cut angle of about (90±30, 90±30, 40±30). In such embodiments, the acoustic wave devices 30, 40 can be LLSAW devices.

The piezoelectric layer 12 has a thickness T1. The thickness T1 of the piezoelectric layer 12 can be selected based on a wavelength λ or L of a surface acoustic wave generated by the LLSAW device. The IDT electrode 14 has a pitch that sets the wavelength λ or L of the LLSAW device. The piezoelectric layer 12 can be sufficiently thick to avoid significant frequency variation. In some embodiments, the thickness T1 of the piezoelectric layer 12 can be in a range of, for example, 0.1 L to 1 L, 0.1 L to 0.5 L, 0.1 L to 0.4 L, 0.1 L to 0.3 L, 0.15 L to 0.4 L, 0.15 L to 0.3 L, or 0.15 L to 0.25 L. In some embodiments, the wavelength L of the surface acoustic wave can be, for example, 1.7 μm and the thickness T1 of the piezoelectric layer 12 can be about 340 nm, in some embodiments.

The IDT electrode 14 has a thickness T2. In some embodiments, the thickness T2 can be about 0.047 L. For example, the thickness T2 of the IDT electrode 14 of the LLSAW device can be in a range of, for example, 0.02 L to 1.16 L, 0.035 L to 0.06 L, 0.04 L to 0.06 L, 0.035 L to 0.05 L, 0.045 L to 0.06 L, or 0.045 L to 0.05 L. In some embodiments, the wavelength L of the surface acoustic wave can be, for example, 1.7 μm and the thickness T2 of the piezoelectric layer 12 can be about 80 nm, in some embodiments. In certain embodiments, the LLSAW device can generate acoustic wave that has an acoustic velocity of about 6400 m/s.

In some embodiments, the acoustic wave devices 30, 40 can have a LN layer as the piezoelectric layer 12 and the LN layer can have a cut angle of about (0, 0, 90). For example, the LN layer can have a cut angle of about (0±30, 0±30, 90±30). In such embodiments, the acoustic wave devices 30, 40 can be laterally excited BAW devices.

In some embodiments, the laterally excited bulk acoustic wave device can generate a Lamb wave that is laterally excited. A resonant frequency of the laterally excited bulk acoustic wave device can depend on a thickness T1 of the piezoelectric layer 12. The thickness T1 of the piezoelectric layer 12 can be a dominant factor in determining the resonant frequency for the laterally excited bulk acoustic wave device. The pitch of the IDT electrode 14 can be a second order factor in determining resonant frequency of the laterally excited bulk acoustic wave device. A thickness of a low impedance layer, such as a silicon dioxide layer, directly over the piezoelectric layer 12 and the IDT electrode and/or directly under the piezoelectric layer 12 can have a secondary impact on the resonant frequency of the laterally excited bulk acoustic wave device. The thickness of such a low impedance layer can be sufficient to adjust resonant frequency for a shunt resonator and a series resonator of a filter.

The resonant frequency of the laterally excited bulk acoustic wave device can be approximated based on Equations 1 and/or 2.

$$v = f * \lambda \qquad \text{(Equation 1)}$$

$$f = \frac{v}{2\lambda} \qquad \text{(Equation 2)}$$

In Equations 1 and 2, v can represent acoustic velocity in a piezoelectric material, f can represent resonant frequency, and λ can represent 2 times the thickness T1 of the piezoelectric layer 12. Accordingly, a combination of the thickness T1 of the piezoelectric layer 12 and the acoustic velocity in the piezoelectric layer 12 can determine the approximate resonant frequency of the laterally excited bulk acoustic wave device. The resonant frequency can be increased by making the piezoelectric layer 12 thinner and/or by using a piezoelectric layer 12 with a higher acoustic velocity.

The piezoelectric layer 12 can be manufactured with a thickness T1 that is 0.2 micrometers or higher from the fabrication point of view. In certain applications, the piezoelectric layer can have a thickness T1>0.04 L from the electromechanical coupling coefficient ($K^2$) point of view, in which L is IDT electrode pitch (a wavelength of a surface acoustic wave generated by the LLSAW device 30, 40).

The laterally excited bulk acoustic wave device with a 0.2 micrometer thick aluminum nitride piezoelectric layer 12 can have a resonant frequency of approximately 25 GHz based on Equations 1 and 2. Similarly, the laterally excited bulk acoustic wave device with a 0.2 micrometer thick lithium niobate piezoelectric layer can have a resonant frequency of approximately 10 GHz. The laterally excited bulk acoustic wave device with a 0.4 micrometer thick lithium niobate piezoelectric layer can have a resonant frequency of approximately 5 GHz. Based on the piezoelectric materials and thickness of the piezoelectric layer, the resonant frequency of the laterally excited bulk acoustic wave device can be designed for filtering an RF signal having a particular frequency.

Odd harmonics for a laterally excited bulk acoustic wave resonator can have a $k^2$ that is sufficiently large for a ladder filter in certain applications. Such odd harmonics (e.g., a 3$^{rd}$ harmonic) can have a $k^2$ that is proportional to fundamental mode $k^2$. A laterally excited bulk acoustic wave resonator using an odd harmonic can have a lithium niobate piezoelectric layer.

Filters that include one or more laterally excited bulk acoustic wave devices can filter radio frequency signals up to about 10 GHz with a relatively wide bandwidth. Filters that include one or more laterally excited bulk acoustic wave devices can filter radio frequency signals having a frequency in a range from 10 GHz to 25 GHz. In some instances, a filter that includes one or more laterally excited bulk acoustic wave devices can filter an RF signal having a frequency in a range from 3 GHz to 5 GHz, a range from 4.5 GHz to 10 GHz, a range from 5 GHz to 10 GHz, or a range from 10 GHz to 25 GHz.

In some embodiments, the thickness T1 of the piezoelectric layer 12 in the laterally excited bulk acoustic wave device can be in a range of, for example, 0.02 L to 0.5 L, 0.04 L to 0.12 L, 0.06 L to 0.12 L, 0.04 L to 0.1 L, or 0.06 L to 0.1 L. In some embodiments, the IDT pitch L of the laterally excited bulk acoustic wave device can be, for example, 5 μm and the thickness T1 of the piezoelectric layer 12 can be about 400 nm, in some embodiments.

In some embodiments, the thickness T2 can be about 0.005 L. For example, the thickness T2 of the IDT electrode 14 of the laterally excited bulk acoustic wave device can be in a range of, for example, 0.002 L to 0.007 L, 0.004 L to 0.007 L, 0.002 L to 0.006 L, or 0.004 L to 0.006 L. In some embodiments, the piezoelectric layer 12 can be configured such that a dielectric material, such as $SiO_2$, is disposed between the IDT fingers. In such embodiments, the thickness T2 can be in a range of, for example, 0.002 L to 0.16 L. In some embodiments, the IDT pitch L of the laterally excited bulk acoustic wave device can be, for example, 5 μm and the thickness T2 of the piezoelectric layer 12 can be about 25 nm, in some embodiments. In certain embodiments, the laterally excited bulk acoustic wave device can generate acoustic wave that has an acoustic velocity of about 24000 m/s. Additional descriptions and examples of laterally excited bulk acoustic wave devices may be found throughout U.S. Patent Application Publication No. 2021/0167752 the entire content of which is incorporated by reference herein in its entirety and for all purposes.

Referring to FIG. 4, in some embodiments, a thickness of the first piezoelectric layer 42 can be greater than a thickness of the second piezoelectric layer 44. For example, the first piezoelectric layer 42 can be greater than the second piezoelectric layer 44 by about the thickness T2 of the IDT electrode 14. In some embodiments, the IDT electrode 14 can be positioned such that the IDT electrode 14 is positioned at a vertical center of the piezoelectric layer 12 so as to a horizontally symmetrical structure.

In some embodiments, the IDT electrode 14 can include aluminum (Al). The IDT electrode 14 may include other metals, such as, molybdenum (Mo), copper (Cu), Magnesium (Mg), tungsten (W), gold (Au), silver (Ag), copper (Cu), platinum (Pt), ruthenium (Ru), titanium (Ti), etc. The IDT electrode 14 may include alloys, such as AlMgCu, AlCu, etc. In some embodiments, the IDT electrode 14 can have a multi-layer IDT electrode structure.

Any suitable principles and advantages of the double mirror structures disclosed herein can be implemented in any acoustic wave devices, such as SAW devices and BAW devices. Any suitable principles and advantages of the acoustic wave devices disclosed herein can be implemented to form an acoustic wave component such as the acoustic wave component 24 illustrated in FIG. 2.

Figure 5:
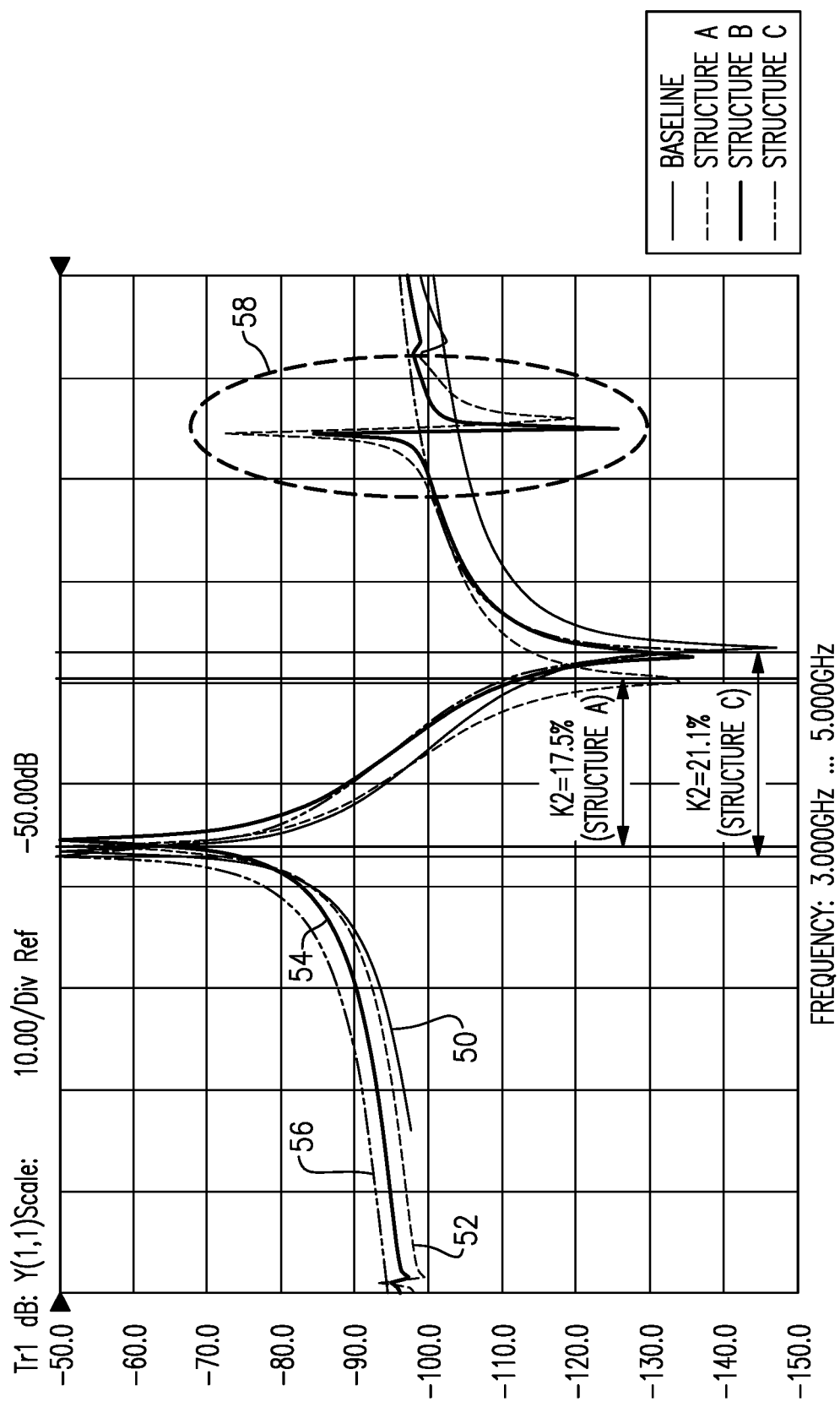
FIG. 5 is a graph showing simulated frequency responses of acoustic wave devices.

FIG. 5 is a graph showing simulated frequency responses of acoustic wave devices that have different structures. The frequency responses of four different LLSAW devices (a baseline structure and structures A-C according to some embodiments) were simulated. The baseline structure is a LLSAW device that has a single mirror structure in which there is no mirror structure over its IDT electrode. The frequency response of the baseline structure is shifted +320 MHz for comparison with the frequency responses of the structures A-C. The structures A-C have the LLSAW device structures illustrated in FIGS. 1A, 3, and 4 respectively. In the simulations, the IDT pitch is set to 1.7 μm; a silicon substrate is used as a support substrate; a Pt layer with a thickness of 0.09 L is used as a low impedance layer, a $SiO_2$ layer with a thickness of 0.14 L us used as a high impedance layer; an Al IDT electrode with a thickness of 0.05 L is used as an IDT electrode; and an LN (90, 90, 40) layer with a thickness of 0.25 L is used as a piezoelectric layer.

The frequency response 52 of the structure A has a resonant frequency of about 3880 MHz, an anti-resonant frequency of about 4200, and a coupling factor ($K_2$) of about 17.5%. The frequency response 54 of the structure B has a resonant frequency of about 3890 MHz, an anti-resonant frequency of about 4250, and a $K_2$ of about 19.2%. The frequency response 56 of the structure C has a resonant frequency of about 3860 MHz, an anti-resonant frequency of about 4260, and a $K_2$ of about 21.1%.

In general, a relatively high $K_2$ can be maintained in the structures A-C as compared to the frequency response 50 of the baseline structure. In certain applications, the structures A-C can be beneficial because such structures can enable a packageless structure while maintaining a relatively high $K_2$. In some embodiments, such a packageless structure can reduce a manufacturing time and/or cost, and/or enable easier handling. The structure B can improve the $K_2$ relative to the structure A, and the structure C can improve the $K_2$ relative to the structure B. An asymmetry mode spurious can be observed in an area 58 for the frequency responses 52, 54 of the structures A and B. However, the asymmetric mode spurious can be reduced or eliminated in the frequency response 54 of the structure C. These differences in $K_2$ and asymmetric mode spurious can be due to horizontal symmetricity of the acoustic wave devices.

FIGS. 6A-6D illustrate a manufacturing process of manufacturing the acoustic wave device 40 illustrated in FIG. 4. At FIG. 6A, a structure that include a first substrate 17, a first solid acoustic mirror 15 positioned over the first substrate 17, and a first piezoelectric layer 42 positioned over the first solid acoustic mirror 15 is provided. The first solid acoustic mirror 15 can include a low impedance layer 20A and a high impedance layer 22A.

At FIG. 6B an opening or cavity 60 is formed on a surface 42a of the first piezoelectric layer 42. In some embodiments, the cavity 60 can be formed by way of etching. A depth of the cavity 60 can be selected based on a thickness of an IDT electrode 14 that will be provided in the cavity 60. In some embodiments, the cavity 60 can be pattered to define a shape of the IDT electrode 14.

At FIG. 6C, the IDT electrode 14 can be formed in the cavity 60. In some embodiments, an upper side 14a of the IDT electrode 14 can be flush with the surface 42a of the first piezoelectric layer 42. At FIG. 6C, another structure that include a second substrate 18, a second solid acoustic mirror 16 positioned over the second substrate 18, and a second piezoelectric layer 44 positioned over the second solid acoustic mirror 16 is provided. The second solid acoustic mirror 16 can include a low impedance layer 20B and a high impedance layer 22B.

At FIG. 6D, the structures illustrated in 6C can be coupled together to define the acoustic wave device 40. A surface 44a of the second piezoelectric layer 44 can be bonded with the surface 42a of the first piezoelectric layer 42. In some embodiments, the first piezoelectric layer 42 and the second piezoelectric layer 44 can be directly bonded to one another. In some embodiments, an oxide layer, such as a silicon dioxide ($SiO_2$) layer, can be provided between the first piezoelectric layer 42 and the second piezoelectric layer 44. In some embodiments, an adhesion layer may be provided between the first piezoelectric layer 42 and the second piezoelectric layer 44. For example, the adhesion layer can be a thin metal layer such as a titanium (Ti) layer. The adhesion layer can be relatively thin, such as less than 50 nm. The bonded first and second piezoelectric layers 42, 44 can define a piezoelectric layer 12 in which the IDT electrode 14 is embedded. In some embodiments, the piezoelectric layer 12 can have a contact line between the first piezoelectric layer 42 and the second piezoelectric layer 44.

In certain manufacturing processes, the second piezoelectric layer 44 may be omitted and the first piezoelectric layer 42 can be the piezoelectric layer 12 to define the acoustic wave device 30 illustrated in FIG. 3. In some embodiments, the second piezoelectric layer 44 can be provided on the first piezoelectric layer 42 prior to providing the second solid acoustic mirror 16.

Figure 7A:
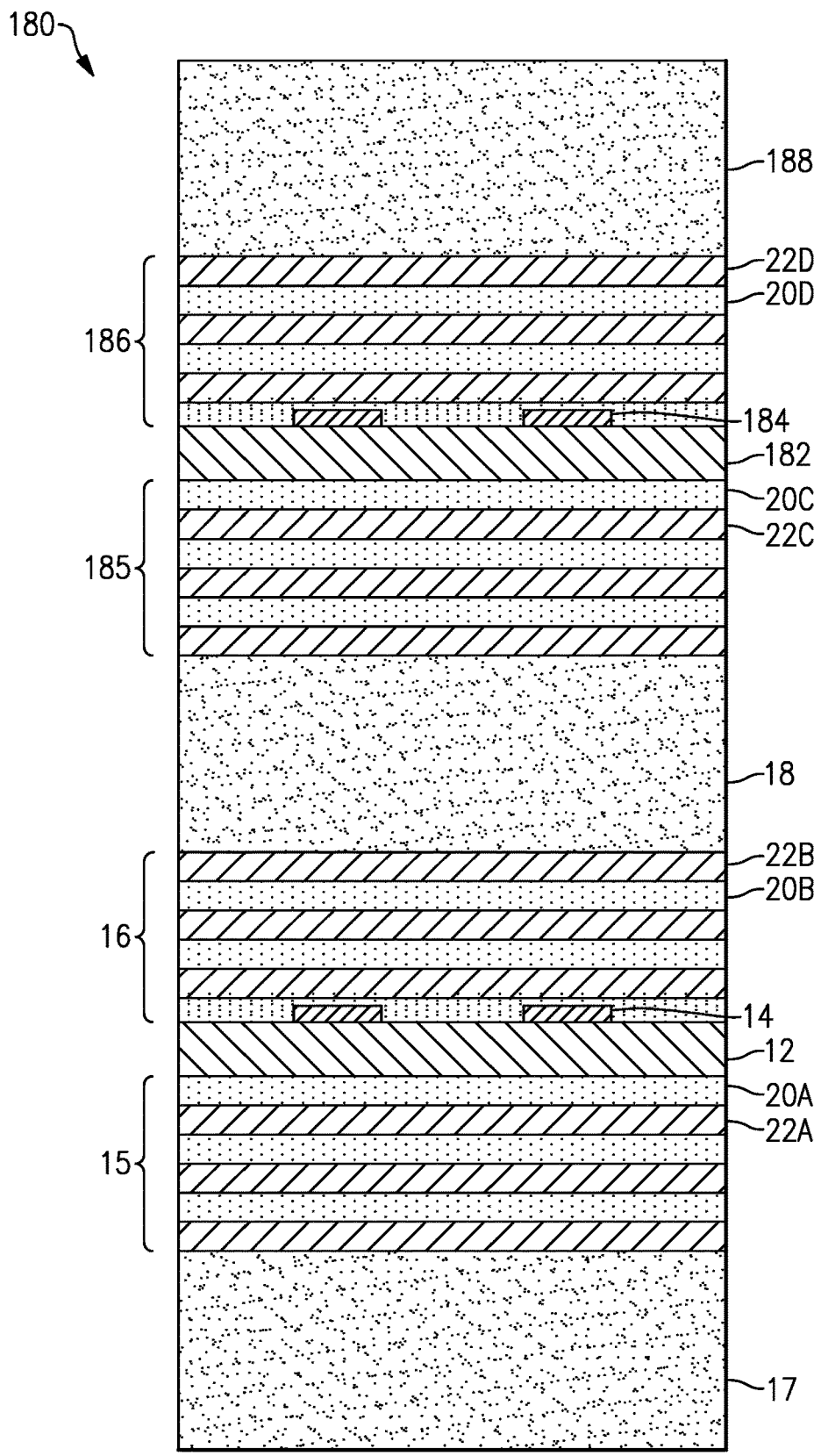
FIG. 7A is a cross sectional diagram of a stacked acoustic wave device assembly according to an embodiment.

FIG. 7A is a cross sectional diagram of a stacked acoustic wave device assembly 180 according to an embodiment. FIG. 7A illustrates that acoustic wave devices can be stacked. The stacked acoustic wave device assembly 180 can implement any suitable principles and advantages disclosed herein. The stacked acoustic wave device assembly 180 can implement a plurality of acoustic wave devices in a relatively small sized component. Such a component can have a relatively small vertical height and/or footprint for implementing a plurality of acoustic wave devices.

As illustrated, the stacked acoustic wave device assembly 180 includes a first substrate 17, a first acoustic wave stack on the first substrate 17, a second substrate 18 positioned on the first acoustic wave stack, a second acoustic wave stack on the second substrate 18, and a third substrate 188.

The first acoustic wave stack includes a piezoelectric layer 12, a IDT electrode 14 on the piezoelectric layer 12, and a first pair of solid acoustic mirrors on opposing sides of the piezoelectric layer 12. The first pair of solid acoustic mirrors includes a first solid acoustic mirror 15 and a second solid acoustic mirror 16.

The second acoustic wave stack includes a second piezoelectric layer 182, a second IDT electrode 184 on the second piezoelectric layer 182, and a second pair of solid acoustic mirrors on opposing sides of the second piezoelectric layer 182. The second pair of second solid acoustic mirrors includes a third solid acoustic mirror 185 and a fourth solid acoustic mirror 186. The second piezoelectric layer 182 can be implemented in accordance with any suitable principles and advantages of the piezoelectric layers disclosed herein. The second IDT electrode 184 can be implemented in accordance with any suitable principles and advantages of the IDT electrodes disclosed herein. The solid acoustic mirrors 185 and 186 include respective low impedance layers 20C and 20D and respective high impedance layers 22C and 22D. The solid acoustic mirrors 185 and 186 can be implemented in accordance with any suitable principles and advantages of the solid acoustic mirrors disclosed herein.

The third substrate 188 can be implemented in accordance with any suitable principles and advantages of the substrates disclosed herein.

In the stacked acoustic wave device assembly 180, the second substrate 18 is implemented as a single support substrate between solid acoustic mirrors of the acoustic wave stacks. The substrates 17, 18, and 188 can each include the same material in certain applications. Two or more of the substrates 17, 18, and 188 can include different materials in some other applications.

The stacked acoustic wave device assembly 180 can include devices of one or more filters arranged to filter RF signals. The first acoustic wave stack and the second acoustic wave stack can implement devices in the same filter in certain applications. The first acoustic wave stack and the second acoustic wave stack can implement devices in different filter in various applications. In some such applications, the different filters can be included in a multiplexer.

Although two devices are stacked in FIG. 7A, three or more acoustic wave devices can be stacked in some other applications. Moreover, although two double mirror acoustic devices are shown in FIG. 7A, a single mirror acoustic wave device can be stacked on a double mirror acoustic wave devices in some other applications.

Figure 7B:
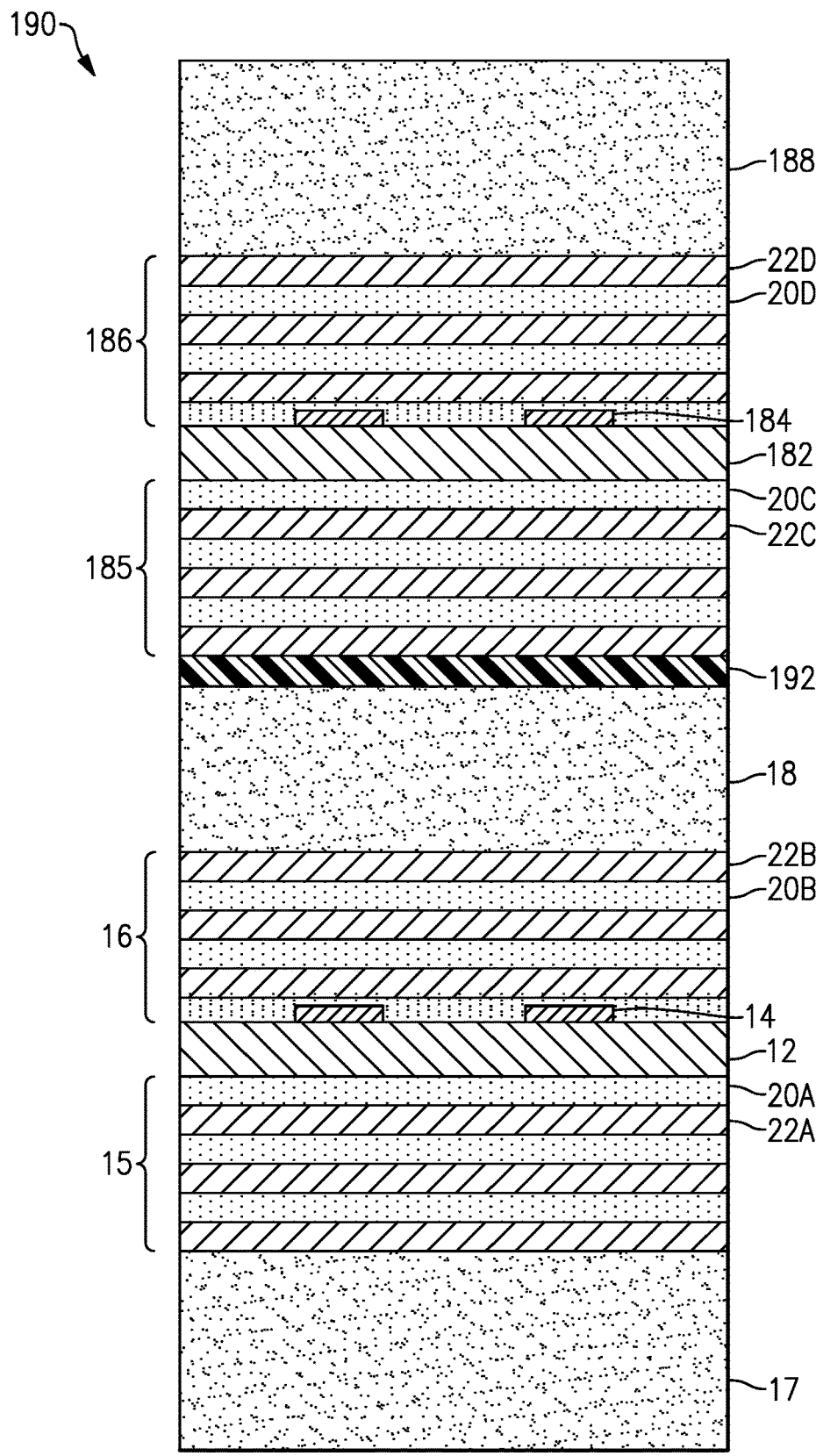
FIG. 7B is a cross sectional diagram of a stacked acoustic wave device assembly according to another embodiment.

FIG. 7B is a cross sectional diagram of a stacked acoustic wave device assembly 190 according to another embodiment. The stacked acoustic wave device assembly 190 can implement any suitable principles and advantages disclosed herein. With stacked structures, firm mechanical connections may not be needed. Accordingly, an adhesion layer can be implemented between layers. The stacked acoustic wave device assembly 190 is like the stacked acoustic wave device assembly 180 of FIG. 7A, except that an adhesion layer 192 is included in the stacked acoustic wave device assembly 190. The adhesion layer 192 can be an epoxy layer. The adhesion layer 192 can be any other suitable layer arranged to increase adhesion between the second substrate 18 and the third solid acoustic mirror 185.

Figure 8:
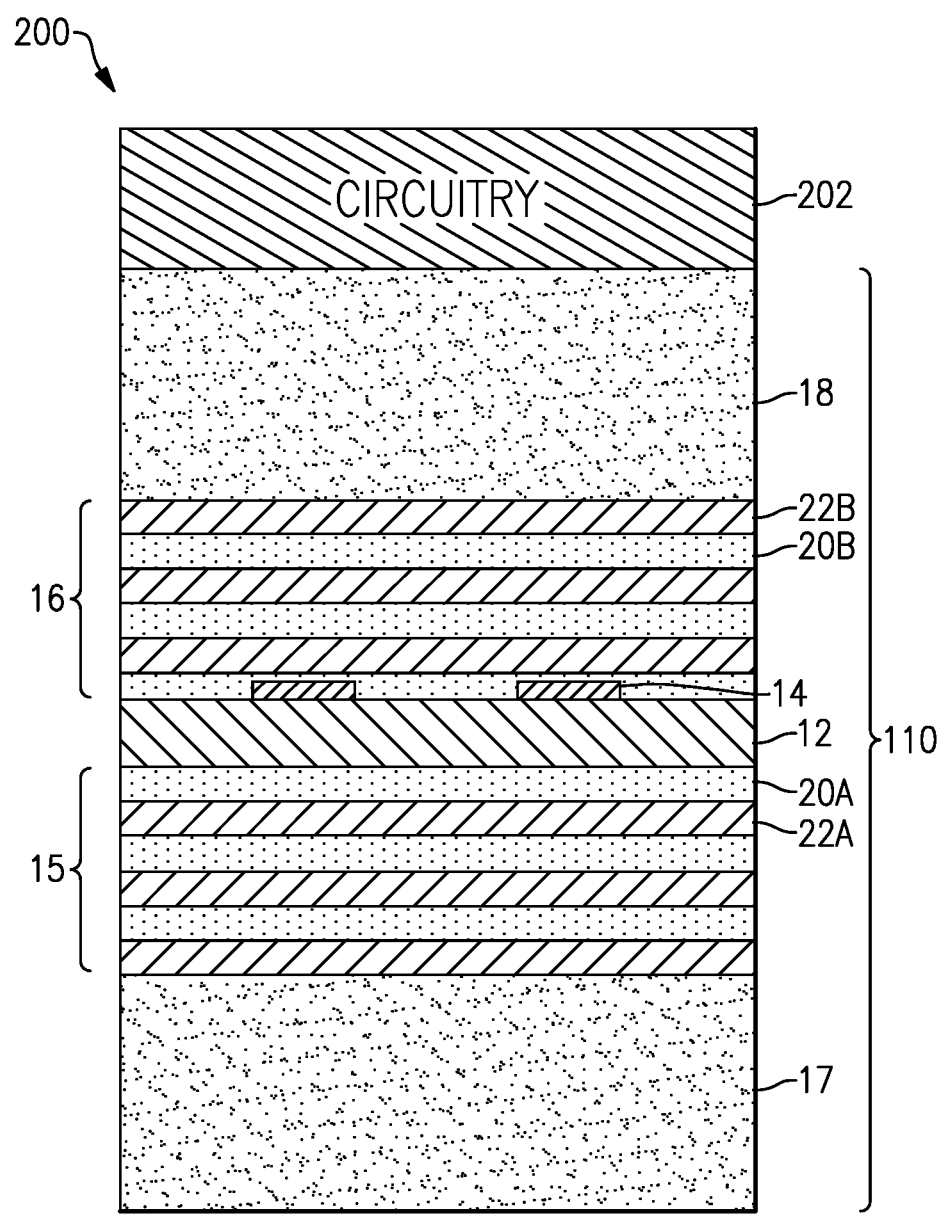
FIG. 8 is a cross sectional diagram of a stacked acoustic wave device assembly with a circuitry according to an embodiment.

An acoustic wave can be stacked with other circuitry. FIG. 8 is a cross sectional diagram of a stacked acoustic wave device assembly 200 with an acoustic wave device 110 stacked with other circuitry 202 according to another embodiment. The stacked acoustic wave device assembly 200 can implement any suitable principles and advantages disclosed herein. As shown in FIG. 8, the other circuitry 202 can be implemented on the second substrate 18. Implementing the other circuitry 202 on the second substrate 18 can enable more integration of electrical components in a module. This can reduce physical size of the module.

The second substrate 18 can be a semiconductor substrate. The second substrate 18 can be a silicon substrate. A variety of other circuitry 202 can be implemented on such a second substrate 18. The other circuitry 202 can include one or more transistors, one or more passive impedance elements, one or more other acoustic wave devices, the like, or any suitable combination thereof.

For example, the other circuitry 202 can include one or more transistors, such as one or more of a semiconductor-on-insulator transistor, a silicon-on-insulator transistor, a complementary metal oxide semiconductor transistor, or the like. Alternatively or additionally, the other circuitry can include one or more passive impedance elements, such as one or more of a capacitor, an inductor, a resistor, a transformer, or a diode. As one more example, the other circuitry can include an acoustic wave device on the second substrate 18. Such an acoustic wave device, can a surface acoustic wave device such as a multi-layer piezoelectric substrate surface acoustic wave device, a bulk acoustic wave device such as a film bulk acoustic wave resonator or s solidly mounted resonator, a boundary wave device, or the like. The acoustic wave device 110 can be included in the same filter as the acoustic wave device of the other circuitry 202. Alternatively, the acoustic wave device 110 can be included in a different filter as the acoustic wave device of the other circuitry 202. The different filters can be included in a multiplexer in some instances.

One or more vias and/or other conductive structures (not shown) in the stacked acoustic wave device assembly 200 can provide an electrical connection between the acoustic wave device 110 and the other circuitry 202. Such electrical connections in the stacked acoustic wave device assembly 200 can reduce an impact of electrical connections between the acoustic wave device 110.

Acoustic wave devices disclosed herein can be implemented in a variety of different filter topologies. Example filter topologies include without limitation, ladder filters, lattice filters, hybrid ladder lattice filters, filters that include ladder stages and a multi-mode surface acoustic wave filter, and the like. Such filters can be band pass filters. In some other applications, such filters include band stop filters. In some instances, acoustic wave devices disclosed herein can be implemented in filters with one or more other types of resonators and/or with passive impedance elements, such as one or more inductors and/or one or more capacitors. Some example filter topologies will now be discussed with reference to FIGS. 9 to 11. Any suitable combination of features of the filter topologies of FIGS. 9 to 11 can be implemented together with each other and/or with other filter topologies.

Figure 9:
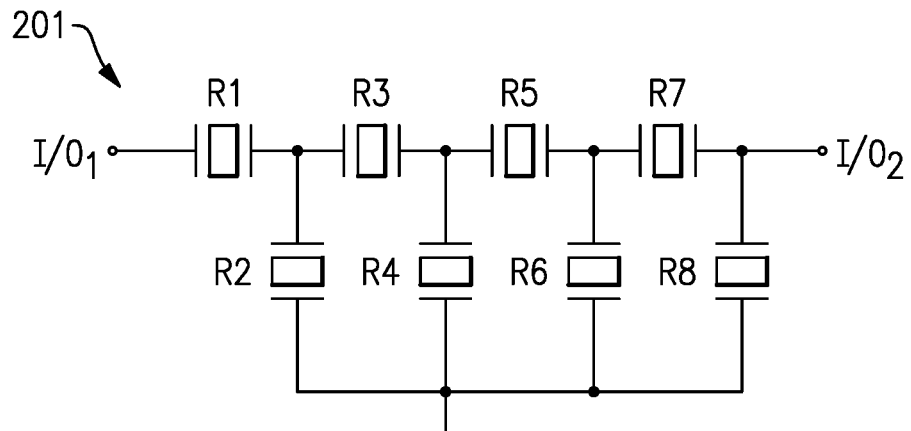
FIG. 9 is a schematic diagram of a ladder filter that includes a laterally excited bulk acoustic wave resonator according to an embodiment.

FIG. 9 is a schematic diagram of a ladder filter 201 that includes an acoustic wave resonator according to an embodiment. The ladder filter 201 is an example topology that can implement a band pass filter formed from acoustic wave resonators. In a band pass filter with a ladder filter topology, the shunt resonators can have lower resonant frequencies than the series resonators. The ladder filter 201 can be arranged to filter a radio frequency signal. As illustrated, the ladder filter 201 includes series acoustic wave resonators R1 R3, R5, and R7 and shunt acoustic wave resonators R2, R4, R6, and R8 coupled between a first input/output port $I/O_1$ and a second input/output port $I/O_2$. Any suitable number of series acoustic wave resonators can be included in a ladder filter. Any suitable number of shunt acoustic wave resonators can be included in a ladder filter.

One or more of the acoustic wave resonators of the ladder filter 201 can include an acoustic wave filter according to an embodiment. In certain applications, all acoustic resonators of the ladder filter 201 can be acoustic wave resonators in accordance with any suitable principles and advantages disclosed herein. According to some applications, the ladder filter 201 can include at least one acoustic wave device according to one embodiment and at least one other acoustic wave device according to another embodiment.

The first input/output port $I/O_1$ can a transmit port and the second input/output port $I/O_2$ can be an antenna port. Alternatively, first input/output port $I/O_1$ can a receive port and the second input/output port $I/O_2$ can be an antenna port.

Figure 10:
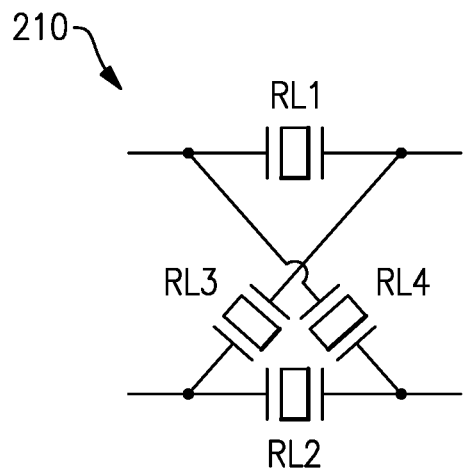
FIG. 10 is a schematic diagram of a lattice filter that includes a laterally excited bulk acoustic wave resonator according to an embodiment.

FIG. 10 is a schematic diagram of a lattice filter 210 that includes an acoustic wave resonator according to an embodiment. The lattice filter 210 is an example topology of a band pass filter formed from acoustic wave resonators. The lattice filter 210 can be arranged to filter an RF signal. As illustrated, the lattice filter 210 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 210 has a balanced input and a balanced output. One or more of the illustrated acoustic wave resonators RL1 to RL4 can be an acoustic wave resonator in accordance with any suitable principles and advantages disclosed herein.

Figure 11:
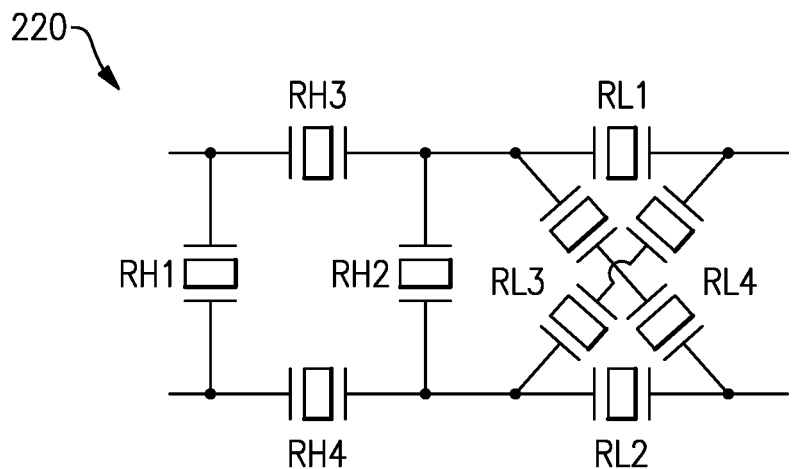
FIG. 11 is a schematic diagram of a hybrid ladder lattice filter that includes a laterally excited bulk acoustic wave resonator according to an embodiment.

FIG. 11 is a schematic diagram of a hybrid ladder and lattice filter 220 that includes an acoustic wave resonator according to an embodiment. The illustrated hybrid ladder and lattice filter 220 includes series acoustic resonators RL1, RL2, RH3, and RH4 and shunt acoustic resonators RL3, RL4, RH1, and RH2. The hybrid ladder and lattice filter 220 includes one or more acoustic wave resonators in accordance with any suitable principles and advantages disclosed herein. For example, the series resonators RL1, RL2, RH3, and RH4 and the shunt resonators RL3, RL4, RH1, and RH2 can each be an acoustic wave resonator according to an embodiment.

According to certain applications, an acoustic wave resonator can be included in filter that also includes one or more inductors and one or more capacitors.

The acoustic wave resonators disclosed herein can be implemented in a standalone filter and/or in a filter in any suitable multiplexer. Such filters can be any suitable topology, such as any filter topology of FIGS. 9 to 11. The filter can be a band pass filter arranged to filter a 4G LTE band and/or 5G NR band. Examples of a standalone filter and multiplexers will be discussed with reference to FIGS. 12A to 12E. Any suitable principles and advantages of these filters and/or multiplexers can be implemented together with each other.

Figure 12A:
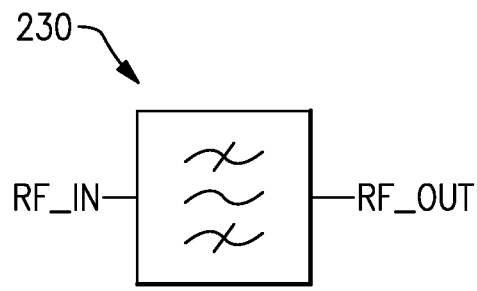
FIG. 12A is a schematic diagram of an acoustic wave filter.

FIG. 12A is schematic diagram of an acoustic wave filter 230. The acoustic wave filter 230 is a band pass filter. The acoustic wave filter 230 is arranged to filter a radio frequency. The acoustic wave filter 230 includes one or more acoustic wave devices coupled between a first input/output port RF_IN and a second input/output port RF OUT. The acoustic wave filter 230 includes an acoustic wave resonator according to an embodiment.

Figure 12B:
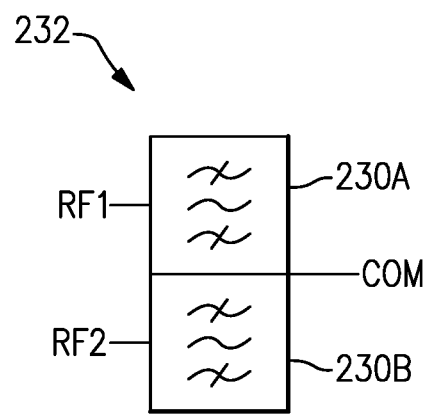
FIG. 12B is a schematic diagram of a duplexer.

FIG. 12B is a schematic diagram of a duplexer 232 that includes an acoustic wave filter according to an embodiment. The duplexer 232 includes a first filter 230A and a second filter 230B coupled to together at a common node COM. One of the filters of the duplexer 232 can be a transmit filter and the other of the filters of the duplexer 232 can be a receive filter. In some other instances, such as in a diversity receive application, the duplexer 232 can include two receive filters. Alternatively, the duplexer 232 can include two transmit filters. The common node COM can be an antenna node.

The first filter 230A is an acoustic wave filter arranged to filter a radio frequency signal. The first filter 230A includes one or more acoustic wave resonators coupled between a first radio frequency node RF1 and the common node COM. The first radio frequency node RF1 can be a transmit node or a receive node. The first filter 230A includes an acoustic wave resonator in accordance with any suitable principles and advantages disclosed herein.

The second filter 230B can be any suitable filter arranged to filter a second radio frequency signal. The second filter 230B can be, for example, an acoustic wave filter, an acoustic wave filter that includes an acoustic wave resonator, an LC filter, a hybrid acoustic wave LC filter, or the like. The second filter 230B is coupled between a second radio frequency node RF2 and the common node. The second radio frequency node RF2 can be a transmit node or a receive node Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of acoustic wave devices.

Figure 12C:
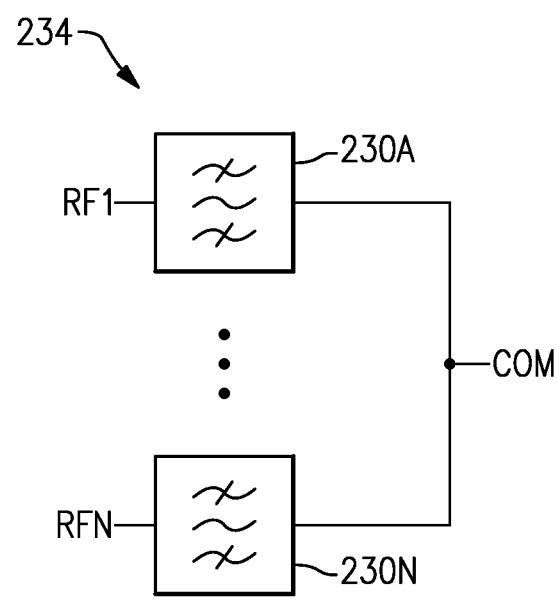
FIG. 12C is a schematic diagram of a multiplexer with hard multiplexing.

FIG. 12C is a schematic diagram of a multiplexer 234 that includes an acoustic wave filter according to an embodiment. The multiplexer 234 includes a plurality of filters 230A to 230N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 230A to 230N each have a fixed electrical connection to the common node COM. This can be referred to as hard multiplexing or fixed multiplexing. Filters have fixed electrical connections to the common node in hard multiplexing applications.

The first filter 230A is an acoustic wave filter arranged to filter a radio frequency signal. The first filter 230A can include one or more acoustic wave devices coupled between a first radio frequency node RF1 and the common node COM. The first radio frequency node RF1 can be a transmit node or a receive node. The first filter 230A includes an acoustic wave resonator in accordance with any suitable principles and advantages disclosed herein. The other filter(s) of the multiplexer 234 can include one or more acoustic wave filters, one or more acoustic wave filters that include an acoustic wave resonator, one or more LC filters, one or more hybrid acoustic wave LC filters, or any suitable combination thereof.

Figure 12D:
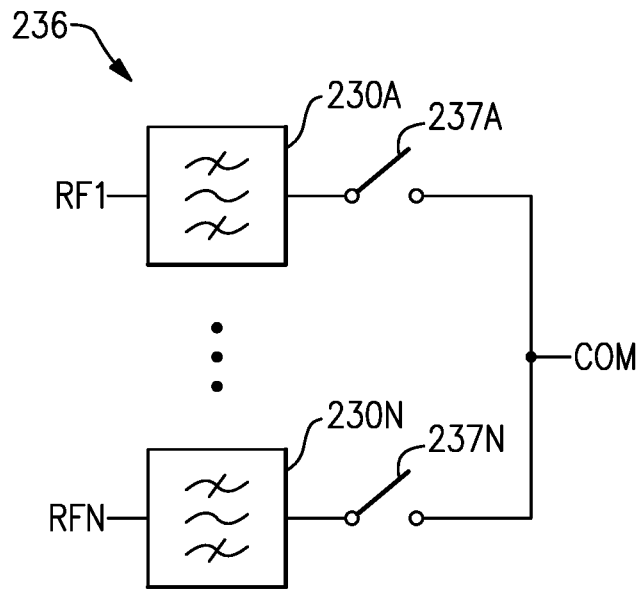
FIG. 12D is a schematic diagram of a multiplexer with switched multiplexing.

FIG. 12D is a schematic diagram of a multiplexer 236 that includes an acoustic wave filter according to an embodiment. The multiplexer 236 is like the multiplexer 234 of FIG. 12C, except that the multiplexer 236 implements switched multiplexing. In switched multiplexing, a filter is coupled to a common node via a switch. In the multiplexer 236, the switch 237A to 237N can selectively electrically connect respective filters 230A to 230N to the common node COM. For example, the switch 237A can selectively electrically connect the first filter 230A the common node COM via the switch 237A. Any suitable number of the switches 237A to 237N can electrically a respective filters 230A to 230N to the common node COM in a given state. Similarly, any suitable number of the switches 237A to 237N can electrically isolate a respective filter 230A to 230N to the common node COM in a given state. The functionality of the switches 237A to 237N can support various carrier aggregations.

Figure 12E:
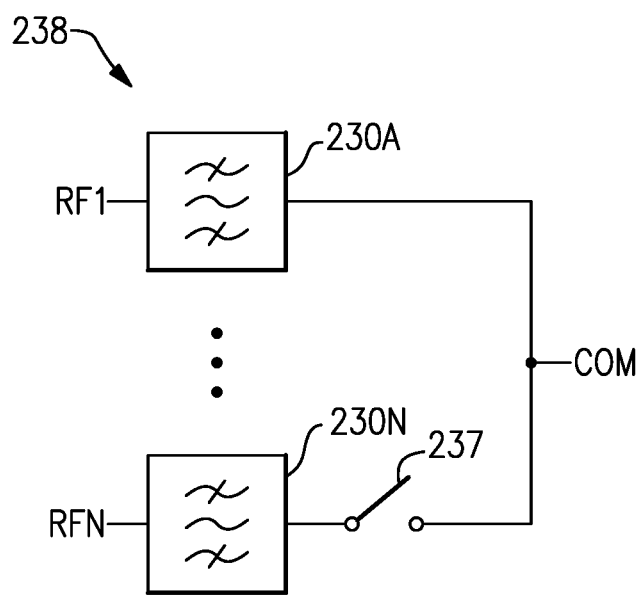
FIG. 12E is a schematic diagram of a multiplexer with a combination of hard multiplexing and switched multiplexing.

FIG. 12E is a schematic diagram of a multiplexer 238 that includes an acoustic wave filter according to an embodiment. The multiplexer 238 illustrates that a multiplexer can include any suitable combination of hard multiplexed and switched multiplexed filters. One or more acoustic wave devices can be included in a filter that is hard multiplexed to the common node of a multiplexer. Alternatively or additionally, one or more acoustic wave devices can be included in a filter that is switch multiplexed to the common node of a multiplexer The acoustic wave devices disclosed herein can be implemented in a variety of packaged modules. Some example packaged modules will now be disclosed in which any suitable principles and advantages of the acoustic wave devices, acoustic wave components, or stacked acoustic wave device assemblies disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 13 to 17 are schematic block diagrams of illustrative packaged modules according to certain embodiments. Any suitable combination of features of these packaged modules can be implemented with each other. While duplexers are illustrated in the example packaged modules of FIGS. 14, 15, and 17, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 13:
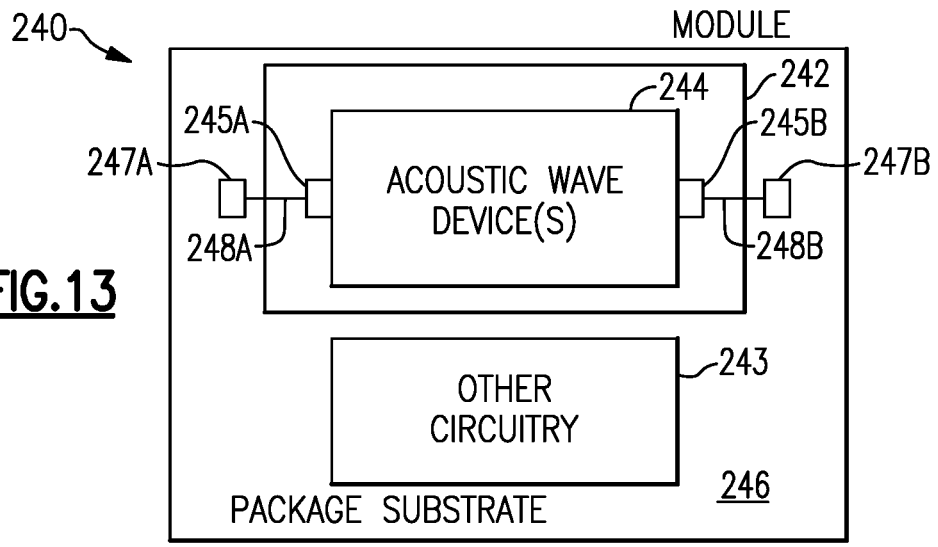
FIG. 13 is a schematic diagram of a radio frequency module that includes an acoustic wave filter according to an embodiment.

FIG. 13 is a schematic diagram of a radio frequency module 240 that includes an acoustic wave component 242 according to an embodiment. The illustrated radio frequency module 240 includes the acoustic wave component 242 and other circuitry 243. The acoustic wave component 242 can include one or more acoustic wave devices in accordance with any suitable combination of features of the acoustic wave filters disclosed herein. The acoustic wave component 242 can include an acoustic wave filter that includes a plurality of acoustic wave resonators, for example.

The acoustic wave component 242 shown in FIG. 13 includes one or more acoustic wave devices 244 and terminals 245A and 245B. The one or more acoustic wave devices 244 includes an acoustic wave device implemented in accordance with any suitable principles and advantages disclosed herein. The terminals 245A and 244B can serve, for example, as an input contact and an output contact. Although two terminals are illustrated, any suitable number of terminals can be implemented for a particular application. The acoustic wave component 242 and the other circuitry 243 are on a common packaging substrate 246 in FIG. 13. The package substrate 246 can be a laminate substrate. The terminals 245A and 245B can be electrically connected to contacts 247A and 247B, respectively, on the packaging substrate 246 by way of electrical connectors 248A and 248B, respectively. The electrical connectors 248A and 248B can be bumps or wire bonds, for example.

The other circuitry 243 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 243 can be electrically connected to the one or more acoustic wave devices 244. The radio frequency module 240 can include one or more packaging structures to, for example, provide protection and/or facilitate easier handling of the radio frequency module 240. Such a packaging structure can include an overmold structure formed over the packaging substrate 246. The overmold structure can encapsulate some or all of the components of the radio frequency module 240.

Figure 14:
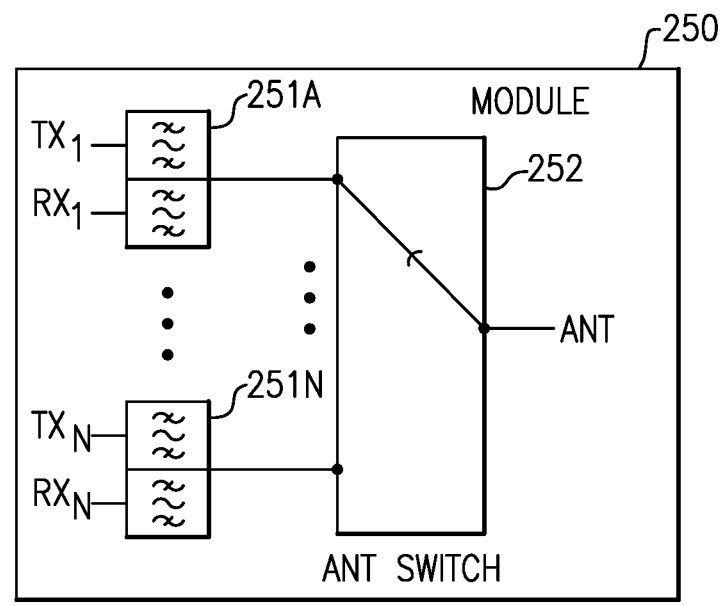
FIG. 14 is a schematic block diagram of a module that includes an antenna switch and duplexers according to an embodiment.

FIG. 14 is a schematic block diagram of a module 250 that includes duplexers 251A to 251N and an antenna switch 252. One or more filters of the duplexers 251A to 251N can include an acoustic wave device in accordance with any suitable principles and advantages disclosed herein. Any suitable number of duplexers 251A to 251N can be implemented. The antenna switch 252 can have a number of throws corresponding to the number of duplexers 251A to 251N. The antenna switch 252 can include one or more additional throws coupled to one or more filters external to the module 250 and/or coupled to other circuitry. The antenna switch 252 can electrically couple a selected duplexer to an antenna port of the module 250.

Figures 15, 16:
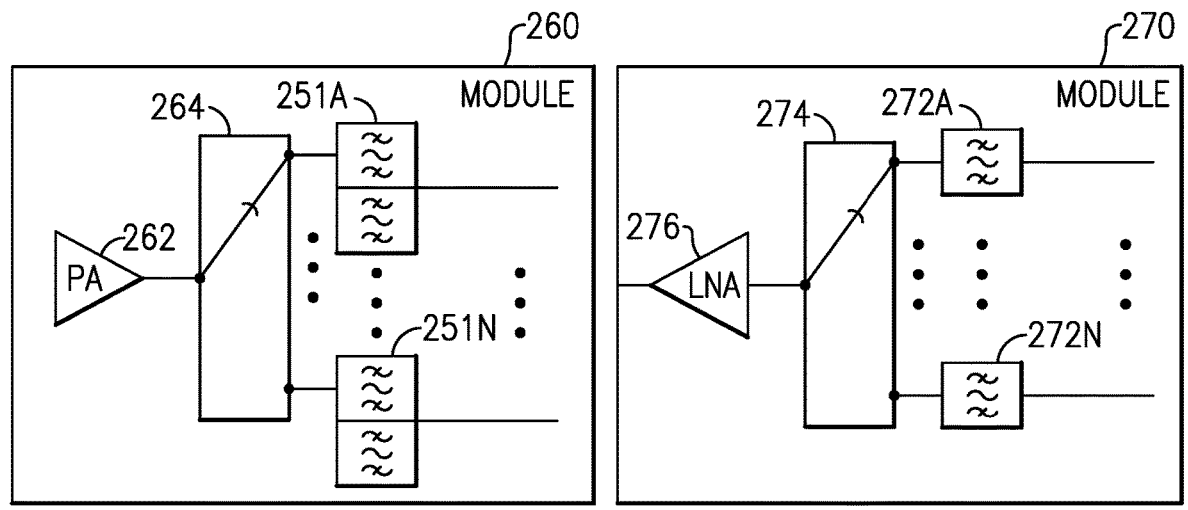
FIG. 15 is a schematic block diagram of a module that includes a power amplifier, a radio frequency switch, and duplexers according to an embodiment.
FIG. 16 is a schematic block diagram of a module that includes a low noise amplifier, a radio frequency switch, and filters according to an embodiment.

FIG. 15 is a schematic block diagram of a module 260 that includes a power amplifier 262, a radio frequency switch 264, and duplexers 251A to 251N according to an embodiment. The power amplifier 262 can amplify a radio frequency signal. The radio frequency switch 264 can be a multi-throw radio frequency switch. The radio frequency switch 264 can electrically couple an output of the power amplifier 262 to a selected transmit filter of the duplexers 251A to 251N. One or more filters of the duplexers 251A to 251N can include an acoustic wave device in accordance with any suitable principles and advantages disclosed herein. Any suitable number of duplexers 251A to 251N can be implemented.

FIG. 16 is a schematic block diagram of a module 270 that includes filters 272A to 272N, a radio frequency switch 274, and a low noise amplifier 276 according to an embodiment. One or more filters of the filters 272A to 272N can include any suitable number of acoustic wave devices in accordance with any suitable principles and advantages disclosed herein. Any suitable number of filters 272A to 272N can be implemented. The illustrated filters 272A to 272N are receive filters. In some embodiments (not illustrated), one or more of the filters 272A to 272N can be included in a multiplexer that also includes a transmit filter. The radio frequency switch 274 can be a multi-throw radio frequency switch. The radio frequency switch 274 can electrically couple an output of a selected filter of filters 272A to 272N to the low noise amplifier 276. In some embodiments (not illustrated), a plurality of low noise amplifiers can be implemented. The module 270 can include diversity receive features in certain applications.

Figure 17:
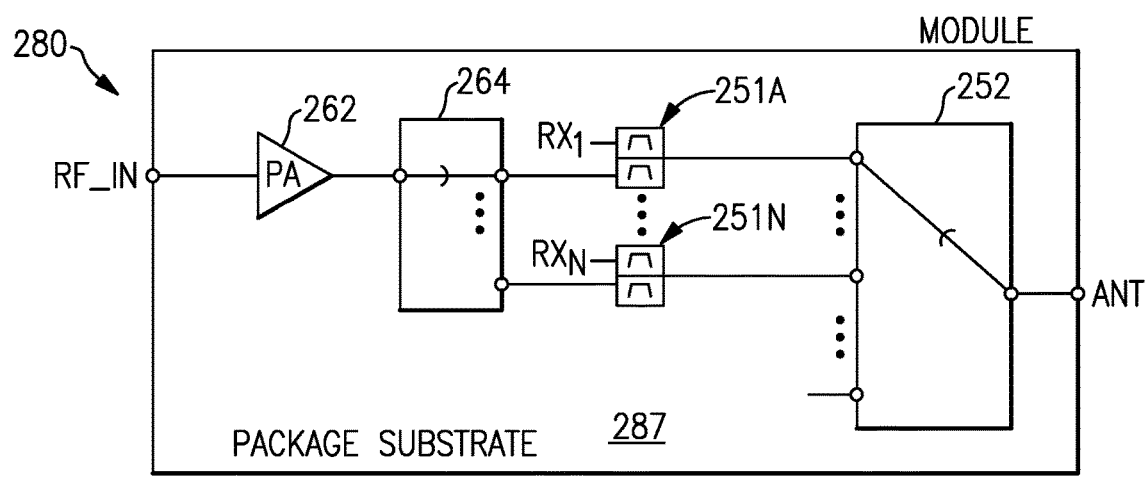
FIG. 17 is a schematic diagram of a radio frequency module that includes an acoustic wave filter according to an embodiment.

FIG. 17 is a schematic diagram of a radio frequency module 280 that includes an acoustic wave filter according to an embodiment. As illustrated, the radio frequency module 280 includes duplexers 251A to 251N, a power amplifier 262, a select switch 264, and an antenna switch 252. The radio frequency module 280 can include a package that encloses the illustrated elements. The illustrated elements can be disposed on a common packaging substrate 287. The packaging substrate 287 can be a laminate substrate, for example. A radio frequency module that includes a power amplifier can be referred to as a power amplifier module. A radio frequency module can include a subset of the elements illustrated in FIG. 17 and/or additional elements. The radio frequency module 280 may include any one of the acoustic wave filters in accordance with any suitable principles and advantages disclosed herein.

The duplexers 251A to 251N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include an acoustic wave device in accordance with any suitable principles and advantages disclosed herein. Similarly, one or more of the receive filters can include an acoustic wave device in accordance with any suitable principles and advantages disclosed herein. Although FIG. 17 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 262 can amplify a radio frequency signal. The illustrated switch 264 is a multi-throw radio frequency switch. The switch 264 can electrically couple an output of the power amplifier 262 to a selected transmit filter of the transmit filters of the duplexers 251A to 251N. In some instances, the switch 264 can electrically connect the output of the power amplifier 262 to more than one of the transmit filters. The antenna switch 252 can selectively couple a signal from one or more of the duplexers 251A to 251N to an antenna port ANT. The duplexers 251A to 251N can be associated with different frequency bands and/or different modes of operation (e.g., different power modes, different signaling modes, etc.).

Figure 18:
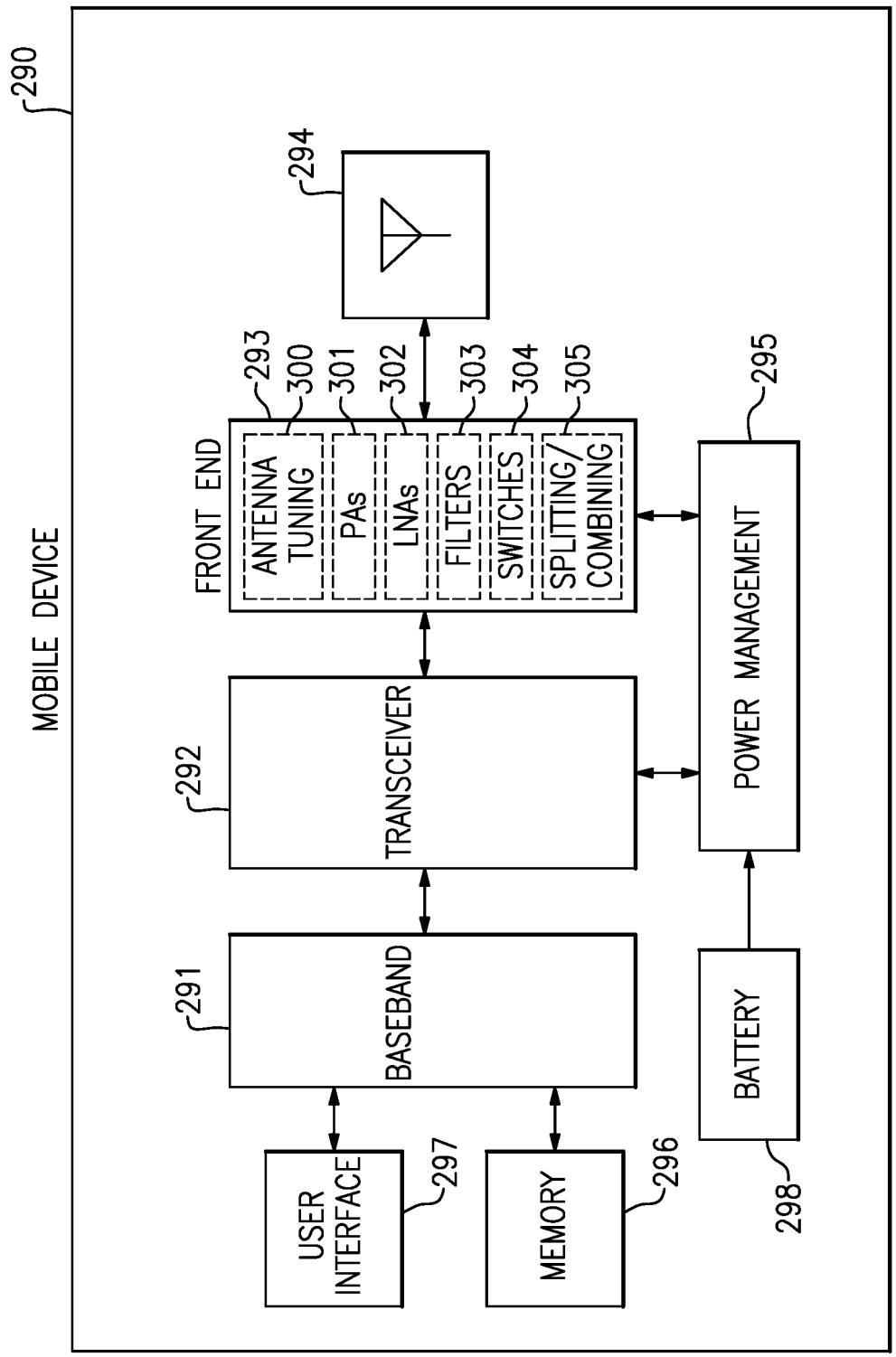
FIG. 18 is a schematic block diagram of a wireless communication device that includes a filter according to an embodiment.

The acoustic wave devices disclosed herein can be implemented in wireless communication devices. FIG. 18 is a schematic block diagram of a wireless communication device 290 that includes a filter according to an embodiment. The wireless communication device 290 can be a mobile device. The wireless communication device 290 can be any suitable wireless communication device. For instance, a wireless communication device 290 can be a mobile phone, such as a smart phone. As illustrated, the wireless communication device 290 includes a baseband system 291, a transceiver 292, a front end system 293, antennas 294, a power management system 295, a memory 296, a user interface 297, and a battery 298.

The wireless communication device 290 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 292 generates RF signals for transmission and processes incoming RF signals received from the antennas 294. Various functionalities associated with the transmission and receiving of RF signals can be achieved by one or more components that are collectively represented in FIG. 18 as the transceiver 292. In one example, separate components (for instance, separate circuits or dies) can be provided for handling certain types of RF signals.

The front end system 293 aids in conditioning signals transmitted to and/or received from the antennas 294. In the illustrated embodiment, the front end system 293 includes antenna tuning circuitry 300, power amplifiers (PAs) 301, low noise amplifiers (LNAs) 302, filters 303, switches 304, and signal splitting/combining circuitry 305. However, other implementations are possible. The filters 303 can include one or more acoustic wave filters that include any suitable number of acoustic wave devices in accordance with any suitable principles and advantages disclosed herein.

For example, the front end system 293 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 290 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 294 can include antennas used for a wide variety of types of communications. For example, the antennas 294 can include antennas for transmitting and/or receiving signals associated with a wide variety of frequencies and communications standards.

In certain implementations, the antennas 294 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 290 can operate with beamforming in certain implementations. For example, the front end system 293 can include amplifiers having controllable gain and phase shifters having controllable phase to provide beam formation and directivity for transmission and/or reception of signals using the antennas 294. For example, in the context of signal transmission, the amplitude and phases of the transmit signals provided to the antennas 294 are controlled such that radiated signals from the antennas 294 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 294 from a particular direction. In certain implementations, the antennas 294 include one or more arrays of antenna elements to enhance beamforming.

The baseband system 291 is coupled to the user interface 297 to facilitate processing of various user input and output (I/O), such as voice and data. The baseband system 291 provides the transceiver 292 with digital representations of transmit signals, which the transceiver 292 processes to generate RF signals for transmission. The baseband system 291 also processes digital representations of received signals provided by the transceiver 292. As shown in FIG. 18, the baseband system 291 is coupled to the memory 296 of facilitate operation of the wireless communication device 290.

The memory 296 can be used for a wide variety of purposes, such as storing data and/or instructions to facilitate the operation of the wireless communication device 290 and/or to provide storage of user information.

The power management system 295 provides a number of power management functions of the wireless communication device 290. In certain implementations, the power management system 295 includes a PA supply control circuit that controls the supply voltages of the power amplifiers 301. For example, the power management system 295 can be configured to change the supply voltage(s) provided to one or more of the power amplifiers 301 to improve efficiency, such as power added efficiency (PAE).

As shown in FIG. 18, the power management system 295 receives a battery voltage from the battery 298. The battery 298 can be any suitable battery for use in the wireless communication device 290, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 25 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, multiplexer, devices, modules, wireless communication devices, apparatus, methods, and systems described herein may be embodied in a variety of other forms. Furthermore, various omissions, substitutions and changes in the form of the filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A longitudinally leaky surface acoustic wave device comprising:
   a support substrate;
   a first solid acoustic mirror over the support substrate;
   a piezoelectric layer positioned over the first solid acoustic mirror;
   an interdigital transducer electrode over the piezoelectric layer, the interdigital transducer electrode configured to generate an acoustic wave that propagates in a lateral direction; and
   a second solid acoustic mirror over the interdigital transducer electrode, the first solid acoustic mirror and the second solid acoustic mirror arranged to confine acoustic energy of the acoustic wave.

2. The longitudinally leaky surface acoustic wave device of claim 1 wherein the piezoelectric layer has a cut angle of (90±30, 90±30, 40±30).

3. The longitudinally leaky surface acoustic wave device of claim 2 wherein the piezoelectric layer is a lithium niobate layer.

4. The longitudinally leaky surface acoustic wave device of claim 3 wherein a thickness of the piezoelectric layer is in a range from 0.1 L to 0.5 L where L is a wavelength of the acoustic wave generated by the longitudinally leaky surface acoustic wave device.

5. The longitudinally leaky surface acoustic wave device of claim 1 wherein at least a portion of the interdigital transducer electrode is embed in the piezoelectric layer.

6. The longitudinally leaky surface acoustic wave device of claim 5 wherein the interdigital transducer electrode is fully embedded in the piezoelectric layer and positioned such that a thickness of the piezoelectric layer under the interdigital transducer electrode is within 80% to 120% of a thickness of the piezoelectric layer over the interdigital transducer electrode.

7. The longitudinally leaky surface acoustic wave device of claim 1 wherein the substrate support substrate is a silicon substrate that is configured to dissipate heat associated with the acoustic wave.

8. The longitudinally leaky surface acoustic wave device of claim 1 further comprising a second substrate configured to dissipate heat associated with the acoustic wave, the first solid acoustic mirror and the second solid acoustic mirror both being positioned between the support substrate and the second substrate.

9. The longitudinally leaky surface acoustic wave device of claim 1 wherein the first solid acoustic mirror is arranged to confine acoustic energy such that the support substrate is free from acoustic energy during operation of the longitudinally leaky surface acoustic wave device.

10. The longitudinally leaky surface acoustic wave device of claim 1 wherein the first solid acoustic mirror is an acoustic Bragg reflector that includes alternating low impedance and high impedance layers.

11. The longitudinally leaky surface acoustic wave device of claim 1 wherein a thickness of the interdigital transducer electrode is in a range from 0.035 L to 0.06 L where L is a wavelength of the acoustic wave generated by the longitudinally leaky surface acoustic wave device.

12. A longitudinally leaky surface acoustic wave component comprising:
a first substrate;
a first solid acoustic mirror positioned on the first substrate;
a piezoelectric layer positioned over the first solid acoustic mirror;
an interdigital transducer electrode on the piezoelectric layer, the interdigital transducer electrode configured to generate an acoustic wave that propagates in a lateral direction;
a second solid acoustic mirror positioned over the interdigital transducer electrode, the first solid acoustic mirror and the second solid acoustic mirror arranged to confine acoustic energy of the acoustic wave; and
a second substrate on the second solid acoustic mirror, the first and second solid acoustic mirrors being positioned between the first and second substrates, the first and second substrates arranged to dissipate heat associated with the acoustic wave.

13. The longitudinally leaky surface acoustic wave component of claim 12 wherein the piezoelectric layer has a cut angle of (90±30, 90±30, 40±30).

14. The longitudinally leaky surface acoustic wave component of claim 12 further comprising a conductive via extending through the second substrate, wherein the conductive via is electrically connected to a longitudinally leaky surface acoustic wave resonator that includes the interdigital transducer electrode.

15. The longitudinally leaky surface acoustic wave component of claim 12 further comprising a third solid acoustic mirror on the second substrate, a second piezoelectric layer on the third solid acoustic mirror, and a second interdigital transducer electrode on the second piezoelectric layer.

16. A longitudinally leaky surface acoustic wave device comprising:
a support substrate;
a first solid acoustic mirror over the support substrate;
a piezoelectric layer over the first solid acoustic, the piezoelectric layer having a cut angle of (90±30, 90±30, 40±30), the interdigital transducer electrode configured to generate an acoustic wave having a wavelength of L;
an interdigital transducer electrode over the piezoelectric layer; and
a second solid acoustic mirror over the interdigital transducer electrode, the first solid acoustic mirror and the second solid acoustic mirror arranged to confine acoustic energy of the acoustic wave.

17. The longitudinally leaky surface acoustic wave device of claim 16 wherein the piezoelectric layer has a cut angle of (90±15, 90±15, 40±15).

18. The longitudinally leaky surface acoustic wave device of claim 16 wherein the piezoelectric layer is a lithium niobate layer.

19. The longitudinally leaky surface acoustic wave device of claim 16 wherein a thickness of the piezoelectric layer is in a range from 0.1 L to 0.5 L.

20. The longitudinally leaky surface acoustic wave device of claim 16 wherein the first solid acoustic mirror is an acoustic Bragg reflector that includes alternating low impedance and high impedance layers.

* * * * *